(12) United States Patent
Buchanan et al.

(10) Patent No.: US 6,984,591 B1
(45) Date of Patent: Jan. 10, 2006

(54) PRECURSOR SOURCE MIXTURES

(75) Inventors: Douglas A. Buchanan, Courtlandt Manor, NY (US); Deborah Ann Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/553,997

(22) Filed: Apr. 20, 2000

(51) Int. Cl.
*H01L 21/31* (2006.01)
*H01L 21/44* (2006.01)
*H01L 23/48* (2006.01)

(52) U.S. Cl. .................. 438/778; 438/680; 438/681; 257/751

(58) Field of Classification Search .......... 438/778, 438/680, 681, 643; 257/751, 295
See application file for complete search history.

(56) References Cited

U.S. PATENT DOCUMENTS

| | | | | |
|---|---|---|---|---|
| 5,231,061 | A | * | 7/1993 | Devore ...................... 428/368 |
| 5,337,651 | A | * | 8/1994 | Gardiner et al. ............ 417/431 |
| 5,382,817 | A | * | 1/1995 | Kashihara et al. .......... 257/295 |
| 5,393,564 | A | * | 2/1995 | Westmoreland et al. . 427/248.1 |
| 5,499,799 | A | * | 3/1996 | Kojima .................. 267/140.13 |
| 5,650,361 | A | * | 7/1997 | Radhakrishnan ... 148/DIG. 113 |
| 5,668,028 | A | * | 9/1997 | Bryant ...................... 438/287 |
| 5,783,716 | A | * | 7/1998 | Baum et al. ................. 556/136 |
| 5,820,664 | A | * | 10/1998 | Gardiner et al. ....... 106/287.17 |
| 5,861,189 | A | * | 1/1999 | Sheel et al. ................. 427/166 |
| 5,879,459 | A | * | 3/1999 | Gadgil et al. ............... 118/715 |
| 5,998,870 | A | * | 12/1999 | Lee et al. .................... 257/751 |
| 6,015,917 | A | * | 1/2000 | Bhandari et al. ............. 556/12 |
| 6,048,790 | A | * | 4/2000 | Iacoponi et al. ............ 438/643 |
| 6,067,244 | A | * | 5/2000 | Ma et al. .................... 365/145 |
| 6,214,105 | B1 | * | 4/2001 | Hintermaier et al. .. 106/287.19 |
| 6,214,729 | B1 | * | 4/2001 | Uhlenbrock et al. ........ 438/681 |
| 6,225,237 | B1 | * | 5/2001 | Vaartstra ..................... 438/778 |
| 6,541,067 | B1 | * | 4/2003 | Marsh et al. ................ 427/252 |

FOREIGN PATENT DOCUMENTS

| | | |
|---|---|---|
| JP | 4-334388 | 11/1992 |
| JP | 5-17142 | 1/1993 |
| JP | 5-136063 | 6/1993 |
| JP | 7-130654 | 5/1995 |
| JP | 7-188254 | 7/1995 |
| JP | 9-40683 | 2/1997 |

(Continued)

*Primary Examiner*—Amir Zarabian
*Assistant Examiner*—Kiesha Rose
(74) *Attorney, Agent, or Firm*—Scully, Scott, Murphy & Presser; Robert M. Trepp, Esq.

(57) ABSTRACT

A precursor source mixture useful for CVD or ALD of a film comprising: at least one precursor composed of an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, to which is bound at least one ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and halogenated, sulfonated or silyated derivatives thereof, which is dissolved, emulsified or suspended in an inert liquid selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate, and mixtures thereof. The precursor source mixture may be a solution, emulsion or suspension and may consist of a mixture of solid, liquid and gas phases which are distributed throughout the mixture.

45 Claims, 9 Drawing Sheets

FOREIGN PATENT DOCUMENTS

| | | |
|---|---|---|
| JP | 10-102253 | 4/1998 |
| JP | 10-298761 | 10/1998 |
| JP | 11-255784 | 9/1999 |
| JP | 11-286494 | 10/1999 |
| JP | 11-317377 | 11/1999 |
| JP | 11-343572 | 12/1999 |
| JP | 2000-44240 | 2/2000 |
| JP | 2000-53422 | 2/2000 |

* cited by examiner

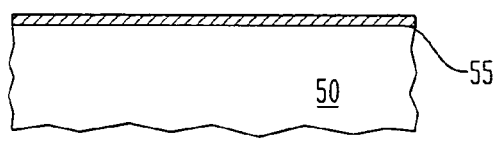
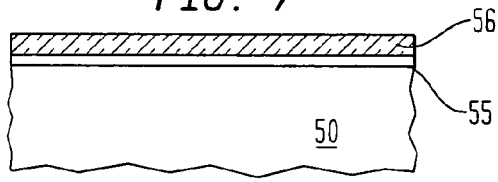
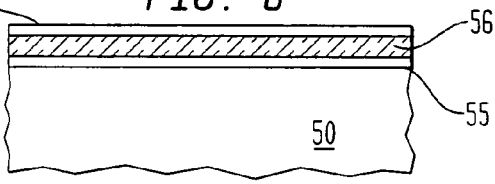
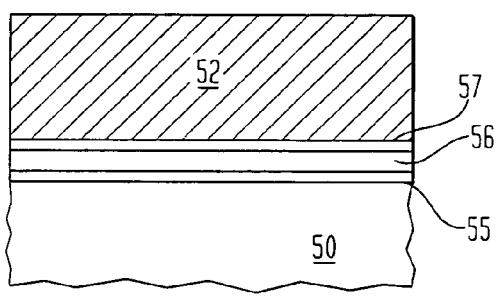
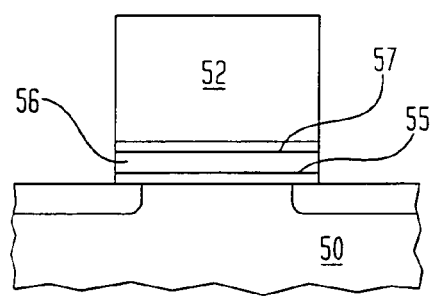
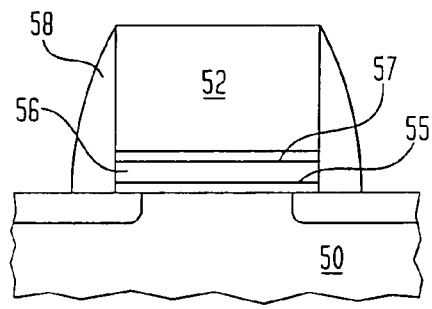
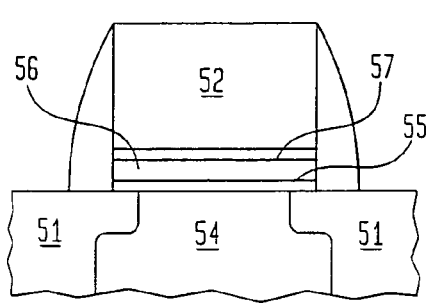

PRECURSOR SOURCE MIXTURES

FIELD OF THE INVENTION

The present invention relates to deposition methods, and more particular to a precursor source mixture that is useful in chemical vapor deposition (CVD) and atomic layer deposition (ALD) processes. The present invention is also directed to a method of fabricating electronic devices that contain at least a film, layer or coating deposited from the precursor source mixture of the present invention.

BACKGROUND OF THE INVENTION

As dimensions of semiconductor devices shrink to improve performance, the need to control film thickness to thinner and thinner uniform dimensions increases. Thickness uniformity is important as dimensions shrink to minimize overlap with adjacent devices. Improvement in uniformity is especially important in current technologies utilizing shallow (0.25 micron) source/drain diffusions. Because shallow diffusions can be obtained by implanting through an oxide, any non-uniformity in that oxide thickness would result in non-uniform source/drain diffusion depths, degrading device performance. Improved thickness uniformity is also important during etching to minimize over-etching which is directly dependent on film uniformity.

Most films deposited by CVD or ALD for semiconductor applications are grown using conventional bubbler technology with a carrier gas bubbled through a neat (i.e., without solvent) precursor at an elevated temperature, relying on the vapor pressure of the precursor to be constant in order to deliver a uniform precursor flux to the film. However, because vapor pressure is directly related to temperature, conventional bubbler technology suffers from the disadvantage of needing to maintain a bubbler temperature with minimal variation during a run or from run to run. Fluctuations in precursor flux are known to result in variable film growth rates. Solid compounds are known to sinter and change surface area over time, resulting in non- uniformity in film growth rates from run to run. Sintering is not a problem for liquid precursors, but over time the liquid precursors may degrade from the thermal cycling and thermal load placed on the precursor. In addition, at elevated temperatures, decomposition processes are accelerated. Elevated temperatures and thermal cycling of a precursor during vaporization in a conventional bubbler may contribute to premature degradation of the precursor over time. Precursors may change their chemical state by ligand rearrangement, cluster formation, or oxidation. Precursors may react with water or oxygen inadvertently introduced into the bubbler through inadequately purified carrier gases bubbled through the precursor, air leaks, or water and oxygen adsorbed on the bubbler walls.

Examples of precursors which are typically used in conventional bubbler technology and suffer from the disadvantages listed above include hydrides, alkyls, alkenyls, cycloalkenyls, aryls, alkynes, carbonyls, amides, phosphides, nitrates, halides, alkoxides, siloxides, and silyls. Thermally unstable hydrides such as alkylamine alanes are especially attractive for CVD and ALD because their high reactivity usually translates into low thermal processing temperatures, and reduced impurity incorporation. Unfortunately, the alkylamine alanes are notoriously unstable during storage, transport and vaporization leading to poor reproducibility in the resultant films. Alkylamine alanes such as trimethylamine alane, triethylamine alane and diethylmethylamine alane are known to decompose at temperatures greater than 40° C. during storage, and during transportation to the CVD reactor. Care must be taken to store the precursors at room temperature or less to minimize decomposition. Transport and vaporization temperatures are thus limited by the thermal decomposition of the precursor, See, for example, Dario M. Frigo, and Gerbrand J. M. van Eijden, Chemistry of Materials, 1994, 6, 190–195 and C. E. Chryssou and C. W. Pitt, Applied Physics A Materials Science and Processing, vol. 65, 1997, 469–475.

Another example of thermally unstable precursors are Cu(I) compounds such as (cyclopentadienyl)Cu(PEt$_3$) which is known to decompose with loss of PEt$_3$ at temperatures as low as 70° C. Other examples include alkyls such as trimethylindium and triethylindium. Triethylindium is a liquid and is known to decompose at room temperature in the bubbler. Trimethylindium is a solid at room temperature and over time a change in the effective vapor pressure is observed resulting in undesirable non- uniformities and irreproducibility of growth results, See, G. B. Stringfellow, Organometallic Vapor-Phase Epitaxy: Theory and Practice (San Diego, Calif.: Academic Press, 1989).

Other examples include alkoxides which are known to change their chemical state by ligand rearrangement, hydrolysis, olgiomerization, ring formation, cluster formation, and/or oxidation over time. At the elevated temperatures encountered in conventional bubbler technology, these decomposition processes are accelerated. In addition, alkoxides are particularly sensitive to water and oxygen impurities which may be inadvertently introduced into the bubbler through inadequately purified carrier gases bubbled through the precursor, air leaks, or water and oxygen adsorbed on the bubbler walls. Hydrolysis reactions can occur and these reactions are accelerated at elevated temperatures which are commonly encountered in conventional bubbler technology. Alkoxides also may exist in a number of isomeric forms which interconvert over time resulting in a variable vapor pressure. For example, aluminum isopropoxide exists in a number of isomeric forms with slow interconversion rates between the isomers. The vapor pressures of these isomers vary widely, making it difficult to control the deposition rate of $Al_2O_3$ grown from this compound using conventional bubbler technology, See R. G. Gordon, K. Kramer, X. Liu, MRS Symp Proc. Vol. 446, 1997, p. 383.

Other examples include amides which behave similiarly to alkoxides, being prone to ligand rearrangement, hydrolysis, oxidation, olgiomerization, ring formation and existing in several interconvertable isomeric forms resulting in irreproducible vapor pressures over time. Other examples include anhydrous metal nitrates such as titanium nitrate, zirconium nitrate and gallium nitrate. These complexes are air and water sensitive and are known to decompose at temperatures around 100° C. The metal oxo-nitrates such as $VO(NO_3)_3$ and $CrO_2(NO_3)_2$ are light sensitive, in addition to being air and water sensitive, and should be stored at 0° C. This is disclosed, for example, in D. G. Colombo, D. C. Gilmer, V. G. Young, S. A. Campbell and W. L. Gladfelter Chem. Vap. Dep. 1998, 4, No. 6, 1998 P. 220.

The use of β-diketonate containing precursors dissolved in solution for CVD growth has been described previously. U.S. Pat. Nos. 5,204,314, 5,225,561, 5,280,012, 5,453,494, and 5,919,522 disclose the growth of Ca, Sr, or Ba containing films using a solution containing a Ca, Sr, or Ba complex bound to at least one β-diketonate ligand, or β-diketonate derivative. U.S. Pat. No. 5,555,154 discloses the growth of $PbZrTiO_3$ by chemical vapor deposition using a solution containing Pb, Zr and Ti dipivaloylmethanates in tetrahydrofuran. U.S. Pat. Nos. 5,677,002 and 5,679,815 disclose the growth of tantalum and niobium containing films using absolution of Nb and Ta bound to a least one β-diketonate ligand or β-diketonate derivative. U.S. Pat. No. 5,698,022 teaches precursor composition useful for chemical vapor deposition of lanthanide metal/phosphorus oxide films, comprising a precursor compound comprised of a lanthanide metal β-diketonate and a phosphorus containing ligand in a solvent. U.S. Pat. No. 5,783,716 teaches the growth of Pt by CVD using a solution containing a Pt complex bound to a least one β-diketonate ligand, or β-diketonate derivative. U.S. Pat. No. 5,820,664 teaches a metal source reagent liquid solution useful for chemical vapor deposition comprising a metal coordination complex including a metal coordinatively bound to a least one β-diketonate ligand or β-diketonate derivative. U.S. Pat. No. 5,900,279 teaches a solution comprised of a β-diketonate containing precursors dissolved in one of the ligands of the complex. U.S. Pat. No. 5,916,359 discloses the growth of $SrBi_2Ta_2O_9$, by CVD using a precursor composition consisting of Sr, Bi, Ta β-diketonate containing precursors dissolved in a three component solution of two different $C_6$–$C_{12}$ alkanes and a glyme-based solvent or polyamine. U.S. Pat. No. 5,980,983 teaches the use of a mixture of metal β-diketonates for deposition of a metal containing film. Despite the numerous disclosures of β-diketonate precusors, β-diketonate-containing precursors are known to have complex decomposition pathways which can lead to incorporation of substantial quantities of carbon or other unwanted impurities into the resultant films.

U.S. Pat. No. 5,900,279 teaches a solution useful for CVD comprised of a metallic organic compound added to a liquid which consists essentially of a ligand of the metallic organic compound. For example, dissolving a M(β-diketonate) in the β-diketone. This reference suffers from the disadvantage of having a huge excess of ligand present during decomposition of the precursor to form the film. The ligand solvent is prone to the same decomposition pathways as the precursor and the precursor decomposition fragments and thus may hinder decomposition of the precursor in the gas phase or on the film surface. Gas phase reactions between the vaporized precursor and partially decomposed precursor and the vaporized ligand solvent and its decomposition by-products are likely and may result in reduced volatility of the precursor, particulate formation in the vaporizer and reactor, and consequently, irreproducible growth rates.

In view of the drawbacks with prior art deposition processes, there is a continued need for developing deposition processes wherein new and improved precursor source mixtures are used for forming thinly deposited layers or films that can be used in various electronic devices.

SUMMARY OF THE INVENTION

The present invention is directed to a precursor source mixture useful for CVD and ALD applications, methods of growing films (as well as layers, coatings and multilayers) utilizing the precursor source mixture of the present invention, and methods of fabricating electronic devices incorporating a film deposited by the inventive method. Suitable electronic devices that can be fabricated in the present invention include, but are not limited to: transistors, capacitors, diodes, resistors, switches, light emitting diodes, lasers, wiring structures, interconnect structures or any other structure wherein the film of the present invention can be incorporated therein.

Specifically, the precursor source mixture of the present invention comprises at least one precursor composed of an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, to which is bound at least one ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and halogenated, sulfonated or silyated derivatives thereof, which is dissolved, emulsified or suspended in an inert liquid selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate, and mixtures thereof. The precursor source mixture may be a solution, emulsion or suspension and may consist of a mixture of solid, liquid and gas phases which are distributed throughout the mixture.

The present invention also relates to a CVD or ALD method of growing a film on a substrate utilizing the precursor source mixture of the present invention. The method of forming the film comprises vaporizing the precursor in the precursor source mixture, and depositing a constituent of the vaporized precursor on a substrate to form a film. In this aspect, the inert liquid, may or may not be co-vaporized with the precursor. In one embodiment, the inert liquid is vaporized with the precursor. In an alternative embodiment of the present invention, the inert liquid is not vaporized and is diverted from the reactor in liquid form.

Another aspect of the present invention relates to the fabrication of multilayer structures incorporating one or more layers deposited by the inventive method.

A still further aspect of the present invention relates to the fabrication of multicomponent films where at least one component is derived from a precursor source mixture of the present invention.

Further aspects of the present invention include:

Fabricating an electronic structure incorporating a film deposited by the inventive method.

Fabricating a complimentary metal oxide semiconductor (CMOS) integrated circuit logic device which contains both n-type field effect transistors (NFET) and p-type field effect transistors (PFET) formed on a single substrate incorporating a film deposited by the inventive method, as shown in FIG. 1.

Fabricating an integrated circuit capacitor incorporating a film deposited by the inventive method, as shown in FIG. 2.

Fabricating an integrated circuit wiring structure incorporating a film deposited by the inventive method, as shown in FIG. 3b.

BRIEF DESCRIPTION OF THE DRAWINGS

FIGS. 5–12 are illustrations of a cross-sectional view of the fabrication of a transistor.

DETAILED DESCRIPTION OF THE INVENTION

Figure 1:
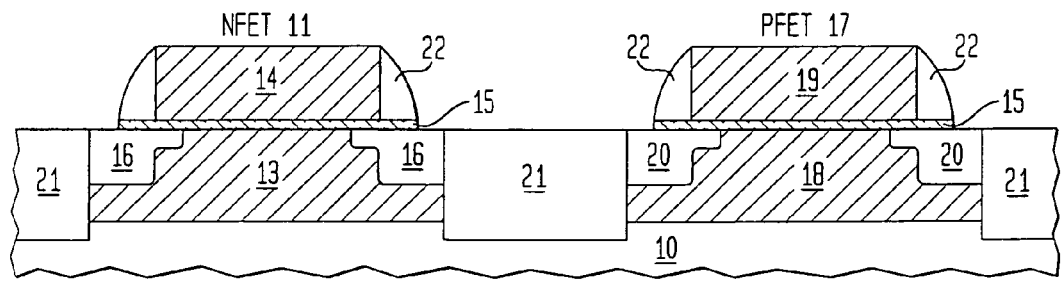
FIG. 1 is an illustration of a cross-sectional view of a integrated circuit with both PFET and NFET devices on a single substrate.

As is stated above, the present invention relates to a precursor source mixture useful for CVD or ALD comprising (i) at least one precursor of the present invention and (ii) an inert liquid.

The precursor is defined as any compound which contains an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, to which is bound at least one ligand selected from the group consisting of hydride (H), alkyl ($CR_3$), alkenyl ($CRCR_2$), cycloalkenyl, aryl, alkyne (CCR), carbonyl (CO), amido ($NR_2$), imido (NR), hydrazido ($NRNR_2$), phosphido ($PR_2$), nitrosyl (NO), nitryl ($NO_2$), nitrate ($NO_3$), nitrile (RCN), isonitrile (RNC), halide (F, Cl, Br, or I), azide ($N_3$), alkoxy (OR), siloxy ($OSiR_3$) silyl ($SiR_3$), and halogenated, sulfonated or silyated derivatives thereof and when delivered to a vaporizer the precursor is readily converted into gaseous form. Halogenated derivatives of the ligands are defined as replacement of H substituent(s) with a halogen selected from the group consisting of F, Cl, Br and I. Sulfonated derivatives of the ligands are defined as replacement of O substituent(s) with S. Silyated derivatives of the ligands are defined as replacement of C substituent(s) with Si.

A generalized formula for the precursor of the present invention is

$$MR^1{}_xR^2{}_yA_z$$

where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi; $R^1$ and $R^2$ are the same or different ligands selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and halogenated, sulfonated or silyated derivatives thereof; A is an optional coordinatively bound or associated ligand selected from the group consisting of phosphines ($R_3P$), phosphites (($RO)_3P$), amines ($R_3N$), arsines ($R_3As$), stibenes ($R_3Sb$), ethers ($R_2O$), sulfides ($R_2S$), nitriles (RCN), isonitriles (RNC) alkenes, hydrazine, pyridines, nitrogen heterocycles, macrocycles, schiff bases, cycloalkenes, alcohols (ROH), phosphine oxides ($R_3PO$), alkylidenes, nitrites, alkynes, and water; $x \geq 1$; x+y=the valence of the element M; $y \geq 0$; and z is $\leq 0$.

The preferred precursors of the present invention are compounds which are readily vaporized. Specifically, the preferred precursors are dimethyl-, diethyl-, or diisobutyl-B, Al, Ga, In, As, or Sb hydride; $Me_2AlH(NEtMe_2)$; tertbutylarsine; $(Me_3N)AlH_3$; $(EtMe_2N)AlH_3$; $(Et_3N)AlH_3$; $CpWH_2$; $Cp_2MoH_2$; trimethyl-, triethyl-, triisobutyl-, tri-n-propyl-, triisopropyl-, tri-n-butyl-, trineopentyl-, or ethyldimethyl-B, Al, Ga, In, As or Sb; tetramethyl-, tetraethyl-, tetraphenyl-, or tetra-n-butyl-Si, Ge, Sn, or Pb; dimethyl-, diethyl-, or diisobutyl-B, Al, Ga, In, As or Sb hydride, chloride, fluoride, bromide, iodide, Cp, amide, dimethylamide or azide; triethyl-, triisobutyl-, tri-n-propyl-, triisopropyl-, tri-n-butyl- or ethyldimethyl-B, Al, Ga, In, As or Sb trimethylamine, diethylmethylamine, dimethylethylamine, or triethylamine; dimethyl or diethyl Zn, Cd, or Hg; (neopentyl)$_4$Cr; $Et_3Pb$(neopentoxy); $Cp_2Me_2Zr$; $(MeNC)_2PtMe_2$; $CpIr(C_2H_4)_2$; bis Cp-Co, Mo, Fe, Mn, Ni, Ru, V, Os, Mg or Cr; bisethylbenzene-, bisbenzene-Co, Mo or Cr; triphenyl-Bi, Sb, or As; trivinylboron; trisCp-Sc, Y, La, Ce, Pr, Nd, Sm, Eu, Gd, Tb, D, Ho, Er, Tm, Yb, or Lu; trisallyliridium; $CpCr(CO)_2$; $Cp_2ZrMe_2$; $CpCuPEt_3$; $EtCp$-$CuPEt_3$; CpIn; CpIr(cyclooctadiene); CpPd(allyl); $CpGaMe_2$; $CpGaEt_2$; (cyclohexadiene)$FeCO_3$; (cyclooctatetraene)$FeCO_3$; ethylferrocene; $CpMn(CO)_3$; (cycloheptatriene) Mo $(CO)_3$; $NdCp_3$; $SmCp_3$; $ScCp_3$; $TbCp_3$; $TlCp$; $TmCp_3$; $Cp_2WH_2$; (mesitylene)$W(CO)_3$; $CpRe(CO)_3$; $CpRh(CO)_2$; $Ir(allyl)_3$; $Pt(allyl)_2$; CpIr(cyclooctanedione); [Ir(OMe)(cyclooctanedione)]$_2$; Ru(cyclooctanedione)(allyl)$_2$; $Ru_3CO_{12}$; $Fe(CO)_5$; $CO_2(CO)_8$; $Ru(CO)_3$ (1,3-cyclohexadiene); $Os_3CO_{12}$; Cr $(CO)_6$; $CpCO(CO)_2$; $Mn_2(CO)_{10}$; $CpMn(CO)_3$; $Mo(CO)_6$; $Ni(CO)_4$; $Re_2(CO)_{10}$; $CpRe(CO)_3$; $CpRh(CO)_2$; $Ru_3(CO)_{12}$; $W(CO)_6$; CpV $(CO)_4$; $CF_3CO(CO)_4$; $Pt(CO)_2$(cyclooctanedione); $Ir(CO)_2$(cyclooctanedione); $(CO)_4Fe[P(OCH_3)_3]$; $(CO)_4Fe[N(CH_3)_3]$; $CoNO(CO)_3$; butoxy, $OCH(CF_3)_2$, $OCMe_2(CF_3)$, $OCMe(CF_3)_2$, $OSi(CH_3)_3$, $OC(CH_3)_3$, $OC(SiMe_3)_3$, or $OC(CF_3)_3$ Li, Na, K, Rb, Cs, Fr, Cu, Ag, Au, Hg, or Tl; tetra-methoxy, tetra-ethoxy, tetra-isopropoxy, tetra-butoxy, tetra n-butoxy, tetra isobutoxy, tetra tertbutoxy, $OCH(CF_3)_2$, $OCMe_2(CF_3)$, $OCMe(CF_3)_2$, $OC(CH_3)_3$, $OC(SiMe_3)_3$, $OC(CF_3)_3$ or $OSi(CH_3)_3$ Si, Ge, Sn, Pb, Ti, Zr, or Hf; $VO(isopropoxy)_3$, tri-isopropoxy, tri-sec-butoxy, tri-n-butoxy, tri-iso-butoxy, tri-methoxy, tri-ethoxy, $(OCH(CF_3)_2)_3$, $(OCMe_2(CF_3))_3$, $(OCMe(CF_3)_2)_3$, $(OC(CH_3)_3)_3$, $(OC(SiMe_3)_3)_3$, $(OC(CF_3)_3)_3$; or $OSi(CH_3)_3)_3$, B, Al, Ga, In, P, As, or Sb; $Et_3Pb$(isopropoxide); (tertbutoxy)$CuPMe_3$; tetrakis(dimethylamino), tetrakis(diethylamino) Ti, Zr, Hf, Si, Ge, Sn, or Pb; diethylaminodiethylarsine; diethylaminoarsine dichloride; bisdimethylaminoarsine chloride; $Me_2Zn$(triethylamine)$_2$; diethylaminodimethylstannane; tris(dimethylamino) phosphine; tris(dimethylamino) antimony; tris (dimethylamino) arsine; tris(dimethylamino) stibine; tris-bis (trimethylsilyl)erbium amide; bis(dimethylamino) (trimethylethylethylenediamino) aluminium; $(CO)_4Fe[N(CH_3)_3]$; Li, Na, or K $N(SiMe_3)$, pentadimethylaminotantalum; diethylaminodimethyltin; hexadimethylaminoditungsten; trisdimethylamino(trimethylethylenediamino)titanium; CpCu(triphenylphospine); (tertbutoxy)$CuPMe_3$; $Pt(PF_3)_4$; $Ni(PF_3)_4$; $Cr(PF_3)_6$; $(Et_3P)_3Mo(CO)_3$; $Ir(PF_3)_4$; Ti $(NO_3)_4$; $Zr(NO_3)_4$; $Hf(NO_3)_4$; $Si(CH_3)_3$ $(NO_3)$; $RuNO(NO_3)_3$; gallium nitrate; $Sn(NO_3)_4$; $Co(NO_3)_3$; $VO(NO_3)_3$; $CrO_2(NO_3)_2$; $TiCl_4$; $HfCl_4$; $ZrCl_4$; $InCl_2$; $ZnCl_2$; $ZnCl_2$; $AlCl_3$; $SiCl_4$; $GaCl_3$; $SnCl_4$; $CoCl_3$; dimethyl-, diethyl-, or diisobutyl-, Al, B, Ge, Si, or As halide; $N(SiMe_3)_2$ Li, Na, or K; $B(CH_2SiMe_3)_3$; $\{(Me_3Si)_2N\}_3$—B, Al, Ga or In; $(Me_3SiCH_2)_4$—Ti, Zr or Hf; $\{(Me_3Si)_2N\}_2$—Zn, Cd or Hg; where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents is contemplated.

An inert liquid is defined as any liquid which does not decompose when in contact with the precursor of the present invention during storage and during vaporization of the precursor. More specifically, the inert liquid employed in the precursor source mixture is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably the inert liquid is composed essentially of a $C_5$–$C_{12}$ alkane. "Essentially composed of" is defined in the present invention as 70–100% by volume. An optional additive can be present provided that it composes no more than 30% by volume of the inert liquid.

The selection of the inert liquid is based on the following criteria: of sufficient inertness not to decompose when in contact with the precursor or during volatilization of the precursor, to pass through the hot zone of the reactor without adversely adsorbing on the growing film surface resulting in incorporation of unwanted impurities in the resultant film.

The precursor source mixture of the present invention may be a solution, emulsion or suspension and may consist of a mixture of solid, liquid and gas phases which are distributed throughout the mixture.

The precursor source mixture of the present invention can be used in any CVD or ALD process with any delivery means currently employed. Thus, the invention is not limited to a specific CVD or ALD apparatus or to any delivery system. Chemical vapor deposition (CVD) is defined as introduction of multiple reagents into a reactor simultaneously. Atomic layer deposition (ALD) is defined as sequential introduction of multiple reagents into a reactor, including, but not limited to: atomic-layer epitaxy, digital chemical vapor deposition, pulsed chemical vapor deposition and other like methods.

In accordance with the present invention, a film is formed on a substrate utilizing the precursor source mixture of the present invention in any CVD or ALD process. The film is formed by vaporizing the precursor in the precursor source mixture, and thereafter depositing a constituent of the vaporized precursor on the substrate. In this aspect, the inert liquid, may or may not be co-vaporized with the precursor. In one embodiment of the present invention, the inert liquid is vaporized with the precursor. In an alternative embodiment, the inert liquid is not vaporized and is diverted from the reactor in liquid form.

In addition to forming a film, the precursor source mixture can be employed in the fabrication of multilayer structures incorporating one or more film layers of the present invention, or in the fabrication of multicomponent films where at least one component is derived from a precursor source mixture of the inventive method.

The precursor source mixtures of the present invention can also be used in the fabrication of a structure, i.e., electronic device structure, incorporating a film deposited by the inventive method. The term "electronic device structure" is used in the present invention to denote transistors, capacitors, diodes, resistors, varistors, switches, light emitting diodes, lasers, wiring structures, and/or interconnect structures.

Moreover, the precursor source mixtures can be used in fabricating a complimentary metal oxide semiconductor (CMOS) integrated circuit logic device. More specifically, the present invention relates to the fabrication of a CMOS integrated circuit containing both n-type field effect transistors (NFET) and p-type field effect transistors (PFET) formed on a single substrate. As shown in FIG. 1, NFET device 11 is formed on a p-type conductivity region 13 of substrate 10 and contains a gate electrode 14 formed on a gate dielectric 15 and a pair of n-type source/drain regions 16 formed on laterally opposite sides of gate electrode 14. Similarly, PFET device 17 is formed on a n-type conductivity region 18 of substrate 10 and contains the gate electrode 19 formed on gate dielectric 15 and a pair of p-type conductivity source/drain regions 20 formed along opposite sidewalls of gate electrode 19. The NFET and PFET devices are separated by shallow trench isolation 21 and by spacers 22. In this aspect of the invention, at least one of the transistor components is deposited by the inventive method including gate electrode 14, gate electrode 19, and/or gate dielectric 15 and/or spacers 22.

Figure 2:
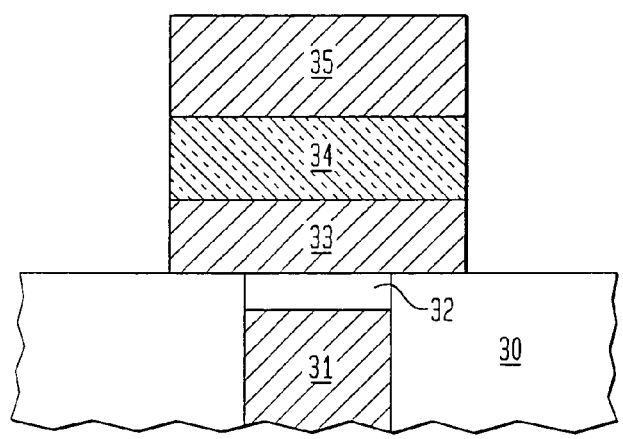
FIG. 2 is an illustration of a cross-sectional view of an integrated circuit capacitor.

The precursor source mixture of the present invention can also be used in fabricating an integrated circuit capacitor. As shown in FIG. 2, a typical capacitor is formed on a substrate 30, connected by a plug 31 to a transistor, with a barrier 32 and consists of a bottom electrode 33, a dielectric material 34 which may or may not be ferroelectric, and a top electrode 35. In this aspect of the invention, at least one of the capacitor components is deposited by the inventive method including plug 31, barrier 32, bottom electrode 33, a dielectric material 34 and/or top electrode 35. The capacitor may be stack or trench.

Figure 3A:
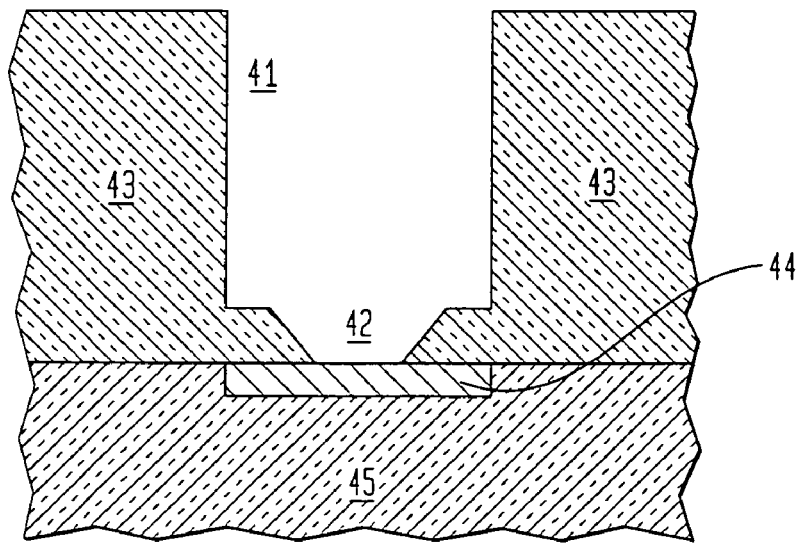
FIGS. 3a–3b are illustrations of a cross-sectional view of an integrated circuit wiring structure.
Figure 3B:
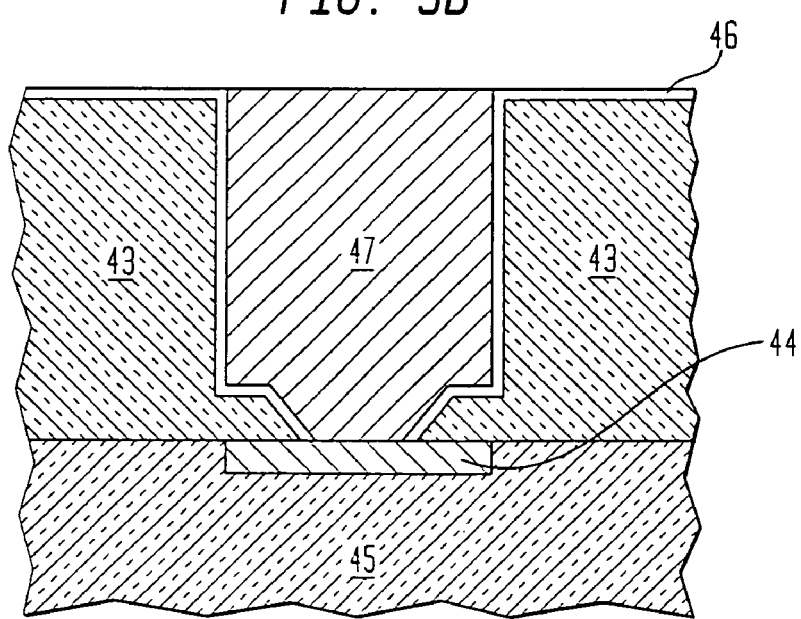

The precursor source mixture can also be used in fabricating a structure of an integrated circuit wiring structure. As shown in FIG. 3a, a typical wiring structure is formed by etching trenches 41 and vias 42 into a dielectric layer 43. Below dielectric layer 43 is a metal thin film wire 44 and a dielectric layer 45 of a wiring layer. In FIG. 3b, the trench and via are filled with a barrier material 46 and a wiring metal 47. In this aspect of the invention, at least one of the wiring structure components is deposited by the inventive method including dielectric layers 43 and 45, metal thin film wire 44, barrier material 46 and/or wiring metal 47.

Barrier layers that conformally coat the etched features of a dual damascene structure can also be fabricating using the precursor source mixture of the present invention.

The above is a generic description of the present invention, the following description provides specific details of the present invention.

Precursor Source Mixtures for Hydride-Containing Compounds

Preferred precursor source mixtures of hydride-containing compounds are comprised of:

(i) $MR^1_x R^2_y A_z$ where M is an element selected from the group consisting of Li, Na, K, Rb, Cs, Fr, Be, Ti, Zr, Hf, V, Nb, Ta, Cr, Mo, W, Mn, Re, Fe, Ru, Os, Co, Rh, Ir, Ni, Pd, Cu, Ag, Au, Zn, Cd, Hg, B, Al, Ga, In, Tl, Si, Ge, Sn, Pb, As, Sb and Bi, preferably B, Al, Ga, In, As, Sb, Si, Ge, Sn, Pb, Zn, Cd and Hg; $R^1$ is a hydride; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitrites, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; $z$ is $\geq 0$; and x+y= the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably, the inert liquid is composed essentially of a $C_5$–$C_{12}$ alkane.

(iii) optional additive

In the case of unstable hydride-containing compounds which have a tendency to decompose during storage or vaporization, additional non-hydride ligands may be added to the mixture to improve the stability of the compound. In the case of unstable adducts of hydride-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfides, nitrites, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one alkyl-containing compound include: trimethyl-, triethyl-, triisobutyl-, tri-n-propyl-, triisopropyl-, tri-n-butyl-, trineopentyl-, or ethyldimethyl-B, Al, Ga, In, As or Sb; tetramethyl-, tetraethyl-, tetraphenyl-, or tetra-n-butyl-Si, Ge, Sn, or Pb; dimethyl-, diethyl-, or diisobutyl-B, Al, Ga, In, As or Sb, hydride, chloride, fluoride, bromide, iodide, Cp, amide, dimethylamide or azide; triethyl-, triisobutyl-, tri-n-propyl-, triisopropyl-, tri-n-butyl- or ethyldimethyl-B, Al, Ga, In, As or Sb trimethylamine, diethylmethylamine, dimethylethylamine, or triethylamine; dimethyl- or diethyl-Zn, Cd, or Hg;(neopentyl)$_4$Cr, Et$_3$Pb(neopentoxy); Cp$_2$Me$_2$Zr; (MeNC)$_2$PtMe$_2$; or CpIr(C$_2$H$_4$)$_2$ where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents dissolved, emulsified or suspended in a $C_5$–$C_{12}$ alkane liquid. Other preferred precursor source mixtures are comprised of at least one alkyl-containing compound including, but not limited to: a trimethyl or triethyl substituent emulsified or suspended in a liquid composed essentially of a $C_5$–$C_{12}$ alkane liquid with optionally added methane or ethane (no more than 30% by volume of the inert liquid).

Precursor Source Mixtures for Alkyl-Containing Compounds

Preferred precursor source mixtures of alkyl-containing compounds are comprised of:

(i) MR$^1_x$R$^2_y$A$_z$ where M is an element selected from the group consisting of Li, Na, K, Rb, Cs, Fr, Be, Ti, Zr, Hf, V, Nb, Ta, Cr, Mo, W, Mn, Re, Fe, Ru, Os, Co, Rh, Ir, Ni, Pd, Cu, Ag, Au, Zn, Cd, Hg, B, Al, Ga, In, Tl, Si, Ge, Sn, Pb, As, Sb and Bi, preferably B, Al, Ga, In, As, Sb, Si, Ge, Sn, Pb, Zn, Cd, Hg; R$^1$ is a $C_1$–$C_8$ alkyl, or $C_4$–$C_{12}$ cycloalkyl; R$^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, R$^1$ and R$^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; $z$ is $\geq 0$; and x+y= the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably, the inert liquid is composed essentially of a $C_5$–$C_{12}$ alkane.

(iii) optional additive

In the case of unstable alkyl-containing compounds which have a tendency to decompose during storage or vaporization, additional alkyl ligands may be added to the mixture to improve the stability of the compound. In the case of unstable adducts of alkyl-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfides, nitrites, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one alkyl-containing compound include: trimethyl-, triethyl-, triisobutyl-, tri-n-propyl-, triisopropyl-, tri-n-butyl-, trineopentyl-, or ethyldimethyl-B, Al, Ga, In, As or Sb; tetramethyl-, tetraethyl-, tetraphenyl-, or tetra-n-butyl-Si, Ge, Sn, or Pb; dimethyl-, diethyl-, or diisobutyl-B, Al, Ga, In, As or Sb, hydride, chloride, fluoride, bromide, iodide, Cp, amide, dimethylamide or azide; triethyl-, triisobutyl-, tri-n-propyl-, triisopropyl-, tri-n-butyl- or ethyldimethyl-B, Al, Ga, In, As or Sb trimethylamine, diethylmethylamine, dimethylethylamine, or triethylamine; dimethyl- or diethyl-Zn, Cd, or Hg; (neopentyl)$_4$Cr; Et$_3$Pb (neopentoxy); Cp$_2$Me$_2$Zr; (MeNC)$_2$PtMe$_2$; or CpIr(C$_2$H$_4$)$_2$ where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents dissolved, emulsified or suspended in a $C_5$–$C_2$ alkane liquid. Other preferred precursor source mixtures are comprised of at least one alkyl-containing compound including, but not limited to: trimethyl or triethyl in emulsified or suspended in a liquid composed essentially of a $C_5$–$C_{12}$ alkane liquid with optionally added methane or ethane (no more than 30% by volume of the inert liquid).

Precursor Source Mixtures for Alkenyl-Containing Compounds

Preferred precursor source mixtures of alkenyl containing compounds are comprised of:

(i) $MR^1_x R^2_y A_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Bi, As, Cr, Zr, Cu, Co, In, Ir, Fe, La, Mg, Mn, Mo, Ni, Os, Ru, Tl, or W; $R^1$ is a $C_1$–$C_8$ alkenyl, $C_4$–$C_{12}$ cycloalkenyl or $C_5$–$C_{12}$ aryl; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y=the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably the inert liquid is composed essentially of $C_5$–$C_{12}$ alkane.

(iii) optional additive

In the case of unstable alkenyl-containing compounds which have a tendency to decompose during storage or vaporization, additional alkenyl ligands may be added to the mixture to improve the stability of the compound. In the case of unstable adducts of alkenyl-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfdes, nitrites, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one alkenyl-containing compound selected from the group consisting of bis Cp Co, Mo, Fe, Mn, Ni, Ru, V, Os, Mg or Cr; bisethylbenzene, bisbenzene Co, Mo or Cr; triphenyl Bi, Sb, or As; trivinylboron, tris Cp Sc, Y, La, Ce, Pr, Nd, Sm, Eu, Gd, Tb, D, Ho, Er, Tm, Yb, or Lu; tetraCpTh, Pa, V, Np, Pu or Am; trisallyliridium; $CpCr(CO)_2$; $Cp_2ZrMe_2$; $CpCuPEt_3$; CpIn; CpIr(cyclooctadiene); CpPd (allyl); $CpGaMe_2$; $CpGaEt_2$; (cyclohexadiene) $FeCO_3$; (cyclooctatetraene)$FeCO_3$; ethylferrocene; CpMn $(CO)_3$; (cycloheptatriene) $Mo(CO)_3$; $NdCp_3$; $SmCp_3$; $ScCp_3$; $TbCp_3$; TlCp; $Cp_2WH_2$; (mesitylene)$W(CO)_3$; CpRe $(CO)_3$; $CpRh(CO)_2$; $Ir(allyl)_3$; $Pt(allyl)_2$; CpIr(cyclooctanedione); [Ir (OMe) (cyclooctanedione)]$_2$; or Ru(cyclooctanedione) (allyl)$_2$ where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents dissolved, emulsified or suspended in C5–C12 alkane liquid.

Precursor Source Mixtures for Carbonyl-Containing Compounds

Preferred precursor source mixtures of carbonyl- containing compounds are comprised of:

(i) $MR^1_x R^2_y A_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Ru, Fe, Co, Os, Cr, Mn, Mo, Ni, Re, Rh, W, Pt, or Ir; $R^1$ is a carbonyl; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y=the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halgenated hydrocarbons, silyated hydrocarbons, thioethers, amines, cyanates; isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive

In the case of unstable carbonyl-containing compounds which have a tendency to decompose during storage or vaporization, additional non-carbonyl ligands may be added to the mixture to improve the stability of the compound. In the case of unstable adducts of carbonyl- containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfides, nitrites, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one carbonyl-containing precursor include: $Ru_3CO_{12}$; $Fe(CO)_5$; $CO_2(CO)_8$; $Ru(CO)_3$ (1,3-cyclohexadiene); $Os_3CO_{12}$; $Cr(CO)_6$; $CpCO(CO)_2$; $Mn_2(CO)_0$; CpMn $(CO)_3$; (cycloheptatriene)$Mo(CO)_3$; $Mo(CO)_6$; $Ni(CO)_4$; $Re_2 (CO)_{10}$; CpRe $(CO)_3$; $CpRh (CO)_2$; $Ru_3 (CO)_{12}$; $W(CO)_6$; CPV $(CO)_4$; $CF_3CO(CO)_4$; $Pt(CO)_2$(cyclooctanedione); $Ir(CO)_2$(cyclooctanedione); $(CO)_4Fe[P(OCH_3)_3]$; $(CO)_4Fe[N(CH_3)_3]$ or $CoNO(CO)_3$ where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents dissolved, emulsified or suspended in a $C_5$–$C_{12}$ alkane liquid.

Precursor Source Mixtures for Alkoxy-Containing Compound

Preferred precursor source mixtures of alkoxy-containing compounds are comprised of:

(i) $MR^1{}_xR^2{}_yA_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably B, Al, Ga, In, As, Sb, Si, Ge, Ti, Zr, or Hf; $R^1$ is an alkoxy or siloxy; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y=the valence of element M.

(ii) inert liquid where the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of $C_5$–$C_{12}$ alkane.

(iii) optional additive

In the case of unstable alkoxy-containing compounds which have a tendency to decompose or chemically rearrange during storage or vaporization, additional alkoxide ligands may be added to the mixture to improve the stability of the compound. In the case of unstable adducts of alkoxy-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfides, nitriles, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one alkoxy-containing precursor include: butoxy, $OCH(CF_3)_2$, $OCMe_2$ $(CF_3)$, $OCMe$ $(CF_3)_2$, $OSi$ $(CH_3)_3$, $OC(CH_3)_3$, $OC(SiMe_3)_3$, or $OC(CF_3)_3$ Li, Na, K, Rb, Cs, Fr, Cu, Ag, Au, Hg, or Tl; tetra-methoxy, tetra-ethoxy, tetra-isopropoxy, tetra-tert-butoxy, tetra-iso-butoxy, tetra-butoxy, tetra-$OCH(CF_3)_2$ tetra-$OCMe_2(CF_3)$, tetra- $OCMe(CF_3)_2$, tetra-$OC(CH_3)_3$, tetra-$OC(SiMe_3)_3$, tetra-$OC(CF_3)_3$ or tetra-$OSi(CH_3)_3$ Si, Ge, Sn, Pb, Ti, Zr, or Hf; $VO(isopropoxy)_3$; tri-isopropoxy, tri-sec-butoxy, tri- n-butoxy, tri-iso-butoxy, tri-methoxy, tri-ethoxy, tri- $OCH(CF_3)_2$, tri-$OCMe_2(CF_3)$, tri-$OCMe(CF_3)_2$, tri-$OC(CH_3)_{31}$ tri-$OC(SiMe_3)_3$, tri-OC $(CF_3)_3$, or tri-$OSi(CH_3)_3$, B, Al, Ga, In, P, As, or Sb;

$Et_3Pb(isopropoxide)$, or $(tertbutoxy)CuPMe_3$, dissolved, emulsified or suspended in a $C_5$–$C_{12}$ alkane liquid.

Precursor Source Mixtures for Amino-Containing Compound

Preferred precursor source mixtures of amino-containing compounds are comprised of:

(i) $MR^1{}_xR^2{}_yA_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably B, Al, Ga, In, As, Sb, Si, Ge, Sn, Pb, Zn, Cd, Hg, Ti, Zr, or Hf; $R^1$ is an amino; $R^2$ is a ligand selected from the group consisting of hydride, alkyl, alkenyl, cycloalkenyl, aryl, alkyne, carbonyl, amido; imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands, A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y= the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive

In the case of unstable amino-containing: compounds which have a tendency to decompose or chemically rearrange during storage or vaporization, additional amino ligands may be added to the mixture to improve the stability of the compound. In the case of unstable adducts of amino-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfides, nitriles, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Highly preferred precursor source mixtures comprised of at least one amino-containing precursor include: tetrakis (dimethylamino), tetrakis(diethylamino) Ti, Zr, Hf, Si, Ge, Sn, or Pb; diethylaminodiethylarsine; diethylaminoarsine dichloride; bisdimethylaminoarsine chloride; $Me_2Zn(tri$-ethylamine$)_2$; diethylaminodimethylstannane; tris(dimethylamino) phosphine; tris(dimethylamino) antimony; tris(dimethylamino) arsine; tris(dimethylamino) stibine; tris-bis (trimethylsilyl) erbium amide; bis(dimethylamino) (trimethylethylethylenediamino) aluminium; $(CO)_4Fe[N (CH_3)_3]$, Li, Na, or K $N(SiMe_3)$; pentadimethylaminotantalum; diethylaminodimethyltin; hexadimethylaminoditungsten, or trisdimethylamino(trimethylethylenediamino)titanium, dissolved, emulsified or suspended in a $C_5$–$C_{12}$ alkane liquid with additional amine.

Precursor Source Mixtures for Phosphido-Containing Compound

Preferred precursor source mixtures of phosphido- containing compounds are comprised of:

(i) $MR^1_x(PR^2_3)_yA_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Cu, Ni, Pt, Ir, Cr, or Mo; $R^1$ and $R^2$ are ligands selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y= the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halgonated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive.

In the case of unstable phosphido-containing compounds which have a tendency to decompose or chemically rearrange during storage or vaporization, additional phospido ligands may be added to the mixture to improve the stability of the compound. In the case of unstable adducts of phosphido-containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfdes, nitriles, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Preferred precursor source mixtures are comprised of CpCu ($PEt_3$); CpCu (triphenylphospine); (tertbutoxy) $CuPMe_3$; Pt $(PF_3)_4$; Ni $(PF_3)_4$; Cr $(PF_3)_6$; $(Et_3P)_3Mo$ $(CO)_3$; or Ir $(PF_3)_4$ where Cp is cyclopentadienyl or substituted cyclopentadienyl wherein replacement of H substituent(s) with methyl, ethyl, isopropyl, n-butyl, sec-butyl, tert-butyl, trimethylsilyl or other like substituents dissolved, emulsified or suspended in a $C_5$–$C_{12}$ alkane liquid with excess of phosphine.

Precursor Source Mixtures for Nitrate-Containing Compound

Preferred precursor source mixtures of nitrate-containing compounds are comprised of:

(i) $MR^1_xR^2_yA_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Ti, Zr, Hf, Si, Ga, Sn, Co, V, or Cr; $R^1$ is a nitrate; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y= the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive

In the case of unstable nitrate-containing compounds which have a tendency to decompose or chemically rearrange during storage or vaporization, additional ligands may be added to the mixture to improve the stability of the compound. In the case of unstable adducts of nitrate- containing compounds, additional adducts may be added to the mixture to improve the stability of the compound. Other coordinating compounds may be added to the mixture to improve stability of the compound as well including, but not limited to: phosphines, phosphites, aryls, amines, arsines, stibenes, ethers, sulfdes, nitrites, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Preferred precursor source mixtures are comprised of $Ti(NO_3)_4$; $Zr(NO_3)_4$; $Hf(NO_3)_4$; $Si(CH_3)_3(NO_3)$; $RuNO$ $(NO_3)_3$; gallium nitrate; $Sn(NO_3)_4$; $Co$ $(NO_3)_3$; $VO(NO_3)_3$; or $CrO_2(NO_3)_2$ dissolved, emulsified or suspended in a $C_5$–$C_{12}$ alkane liquid.

Precursor Source Mixtures for Halide-Containing Compounds

Preferred precursor source mixtures of halide-containing compounds are comprised of:

(i) $MR^1_xR^2_yA_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Ti, Zr, Hf, Si, Ga, Sn, Co, V, or Cr; $R^1$ is a halide; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, or water; $x \geq 1$; $y \geq 0$; z is $\geq 0$; and x+y=the valence of element M.

(ii) inert liquid wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive

In the case of unstable halide-containing compounds which have a tendency to decompose or chemically rearrange during storage or vaporization, additional halide ligands may be added to the mixture to improve the stability of the compound. In the case of unstable adducts of halide-containing compounds, additional adducts may be added to the mixture to improve the stability of the compound. Other coordinating compounds may be added to the mixture to improve stability of the compound as well including: phosphines, phosphites, aryls, amines, arsines, stibenes, ethers, sulfdes, nitriles, isonitriles, alkenes, pyridines, heterocycles, tetrahydrofuran, dimethylformamide, marcrocycles, schiff bases; cycloalkenes, alcohols, phosphine oxides, or alkynes. All optional additives will comprise no more than 30% by volume of the inert liquid.

Preferred precursor source mixtures are comprised of $TiCl_4$; $ZnCl_2$; $ZrCl_4$; $HfCl_4$; $AlCl_3$; $SiCl_4$; $GaCl_3$; $SnCl_4$; $CoCl_3$; dimethyl, diethyl, or diisobutyl, Al, B, Ge, Si, or As halide, dissolved, emulsified or suspended in a $C_5$–$C_{12}$ alkane liquid.

Precursor Source Mixtures for Silyl-Containing Compounds

Preferred precursor source mixtures of silyl-containing compounds are comprised of:

(i) $MR^1_x R^2_y A_z$ where M is an element selected from the group consisting of Li, Na, K, Rb, Cs, Fr, Be, Mg, Ti, Zr, Hf, Sc, Y, La, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, Ga, In, Tl, Si, Ge, Sn, Pb, As, P, Sb and Bi, preferably Ti, Zr, Hf, Si, Ga, Sn, Co, V, or Cr; $R^1$ is a silyl; $R^2$ is a ligand selected from the group consisting of hydride, alkyl, alkenyl, cycloalkenyl, aryl, alkyne, carbonyl, amido, imido, hydrazido, phosphido, nitrosyl, nitryl, nitrate, nitrile, halide, azide, alkoxy, siloxy, silyl, and/or halogenated, sulfonated or silyated derivatives thereof, $R^1$ and $R^2$ may or may not be identical ligands; A is an optional coordinatively bound ligand selected from the group consisting of phosphines, phosphites, aryls, amines, arsines, stibenes, ethers, sulfides, nitriles, isonitriles, alkenes, alkynes, hydrazine, pyridines, nitrogen heterocycles, macrocycles, schiff bases, cycloalkenes, alcohols, phosphine oxides, alkylidenes, nitrites, and water; $x \geq 1$; $y \geq 0$; z is $\geq 0$; and x+y= the valence of element M.

(ii) inert liquid.

wherein the inert liquid is selected from the group consisting of aliphatic hydrocarbons, aromatic hydrocarbons, alcohols, ethers, aldehydes, ketones, acids, phenols, esters, amines, alkylnitrile, halogenated hydrocarbons, silyated hydrocarbons, thioethers, amines, cyanates, isocyanates, thiocyanates, silicone oils, nitroalkyl, alkylnitrate and/or mixtures of one or more of the above. Preferably a liquid composed essentially of a $C_5$–$C_{12}$ alkane.

(iii) optional additive

In the case of unstable silyl-containing compounds which have a tendency to decompose or chemically rearrange during storage or vaporization, additional silyl ligands may be added to the mixture to improve the stability of the compound. In the case of unstable adducts of silyl containing compounds, additional adducts may be added to the mixture to improve the stability of the compound. Other coordinating compounds may be added to the mixture to improve stability of the compound as well including: phosphines, phosphites, aryls, amines, arsines, stibenes, ethers, sulfdes, nitriles, isonitriles, alkenes, pyridines, heterocycles, tetrahydrofuran, dimethylformamide, marcrocycles, schiff bases, cycloalkenes, alcohols, phosphine oxides, or alkynes. All optional additives will comprise no more than 30% by volume of the inert liquid.

Preferred precursor source mixtures are comprised of $N(SiMe_3)_2Li$, Na, or K; $B(CH_2SiMe_3)_3$; $\{(Me_3Si)_2N\}_3$ B, Al, Ga or In; $(Me_3SiCH_2)_4$ Ti, Zr or Hf; $\{(Me_3Si)_2N\}_2$ Zn, Cd or Hg dissolved, emulsified or suspended in a $C_5$–$C_{12}$ alkane liquid.

The following examples are given to illustrate the present invention and to demonstrate some advantages that can arise therefrom.

EXAMPLE 1

Deposition of a Film in a Chemical Vapor Deposition Reactor utilizing a Precursor Source Mixture In this example, a substrate is placed in a suitable reactor for CVD, and a multicomponent metal, metal oxide, metal nitride or metal silicide Hf- and Al-containing film is deposited using two different precursor source mixtures.

The hafnium-containing precursor source mixture is comprised of 50 grams of tetrakis(dimethylamino) hafnium and 1 gram of dimethylamine in a liter of pentane. The aluminum-containing precursor source mixture is comprised of 50 grams of trimethylamine alane and 1 gram of trimethylamine in a liter of pentane. In this example, the precursor source mixtures are vaporized in an vaporizer and the vapor is introduced into the CVD reactor. The precursor source mixtures are vaporized at 40°–260° C., preferably 40°–180° C. The substrate temperature is from about 100°–1200° C., and preferably 20°–700° C. In order to deposit a metal film, a reducing reactant is introduced including, but not limited to: hydrogen, forming gas and combinations thereof. The preferred reductant is forming gas. In order to deposit a metal oxide film, an oxidant is introduced including, but not limited to: oxygen, ozone, water, hydrogen peroxide, nitrous oxide and combinations thereof. The preferred oxidant is oxygen. In order to deposit a metal nitride film, a nitriding reactant is introduced including, but not limited to: ammonia, hydrazine, hydrogen azide, tertbutylamine, and combinations thereof. The preferred nitriding reactant is ammonia. In order to deposit a metal silicide film, a silyating agent including, but not limited to: silane, dislanes, chlorosilanes, silylamines, and silazanes, and a reducing agent are introduced into the CVD reactor along with the precursor vapor. The vapor of the precursor source mixtures and reactants are introduced simultaneously, preferably through separate inlets.

The inventive method described can be expanded to include growth of any multicomponent metal, metal oxide, metal nitride or metal silicide film deposited by chemical vapor deposition utilizing two or more different precursor source mixtures or utilizing a precursor source mixture which contains two or more precursors. The inventive method described can be expanded to include growth of any multicomponent metal, metal oxide, metal nitride or metal silicide film deposited by chemical vapor deposition providing at least one component of the multicomponent film is derived from a precursor source mixture. The other components of the film may be deposited utilizing conventional bubbler technology or precursor sources not covered in this invention. The inventive method described can be expanded to include growth of any single component metal, metal oxide, metal nitride or metal silicide film deposited by chemical vapor deposition utilizing one precursor source mixture which contains only one precursor.

EXAMPLE 2

Method of Film Growth wherein the Inert Liquid is not Vaporized

In this example, the inert liquid is not vaporized and is diverted from the CVD or ALD reactor. The precursor source mixtures is comprised of a precursor and an inert liquid which vaporizes at a higher temperature than the precursor. The precursor source mixture is introduced into the vaporizer where the precursor is vaporized. The inert liquid is not vaporized, but instead is diverted from the reactor in liquid form.

Figure 29:
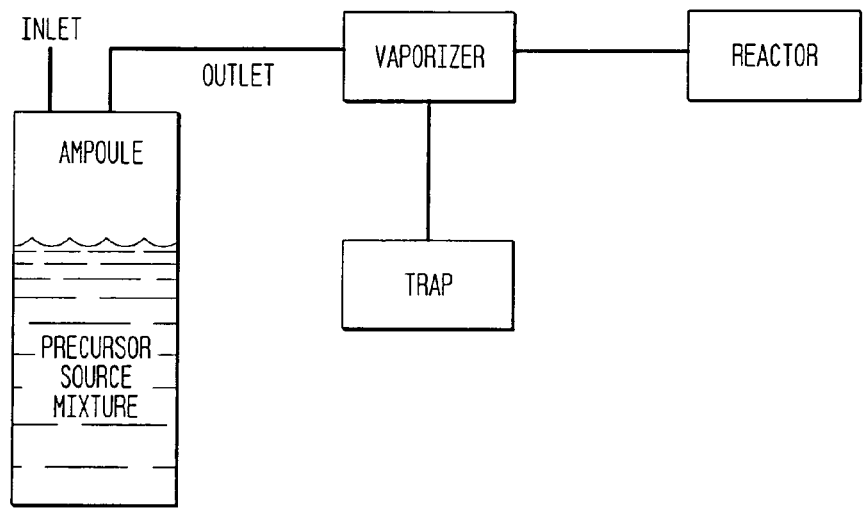
FIG. 29 is a schematic representation of a delivery system for chemical vapor deposition or atomic layer deposition of a film or coating.

One possible apparatus configuration is shown in FIG. 29. As shown in FIG. 29, the precursor source mixture would flow from the ampoule to the vaporizer. The precursor in the precursor source mixture would be vaporized in the vaporizer, but the inert liquid would not. The vaporized precursor would be transported to the reactor, and the non-vaporized inert liquid would drain out of the vaporizer and be collected in a trap. The vaporizer temperature would be set at less than the boiling point of the inert liquid.

One preferred method would comprise a precursor source mixtures composed of dimethylethylamine alane and decane (boiling point 174° C.) with the vaporizer temperature set at 90° C.

The inventive method described can be expanded to include growth of any single or multicomponent film deposited by chemical vapor deposition or atomic layer deposition, providing that the vaporizer temperature is sufficient to volatilize the precursor(s) and less than the boiling point of the inert liquid in the precursor source mixture.

EXAMPLE 3

Deposition of a Metal, Metal Oxide, or Metal Nitride in a Atomic Layer Deposition Reactor Utilizing a Precursor Source Mixture In this embodiment, a substrate is placed in a suitable reactor for ALD, for example the commercial F-200 reactor made by Microchemistry, and a multicomponent metal, metal oxide, or metal nitride film containing Zr and Hf is deposited using two different precursor source mixtures. ALD is performed in a cyclic fashion with sequential alternating pulses of vaporized precursor, reactant and purge gas.

The zirconium-containing precursor source mixture is comprised of 50 grams of zirconium nitrate in a liter of pentane. The hafnium-containing precursor source mixture is comprised of 50 grams of hafnium tertbutoxide in a liter of pentane. In this example, the precursor source mixtures are vaporized in an vaporizer and the vapor is introduced into the reactor in a cyclical fashion. In order to deposit a metal film, a reducing reactant is introduced including, but not limited to: hydrogen, forming gas and combinations thereof. The preferred reductant is forming gas. In order to deposit a metal oxide film, an oxidant is introduced including, but not limited to: oxygen, ozone, water, hydgrogen peroxide, nitrous oxide and combinations thereof. The preferred oxidant is water. In order to deposit a metal nitride film, a nitriding reactant is introduced including, but not limited to: ammonia, hydrazine, hydrogen azide, tertbutylamine, and combinations thereof. The preferred nitriding reactant is ammonia.

The precursor source mixtures are vaporized at 40°–260° C., preferably 40°–180° C. The substrate temperature is about 100°–1200° C., and preferably 150°–500° C. The precursor, reactant and inert purge gas ($N_2$ or Ar or other inert gas) are pulsed into the reactor in the following sequence:

1. vapor of Hf-containing precursor source mixture
2. inert purge
3. reactant
4. inert purge
5. vapor of Zr-containing precursor source mixture
6. inert purge
7. reactant
8. inert purge The precursor and reactant pulses (steps 1, and 5, and 3, and 7, respectively) last 0.1–1 second, preferably 0.5 seconds. The inert gas purge pulse (steps 2, 4, 6, and 8) last 0.2–5 seconds, preferably 2 seconds. Completion of steps 1–8 is a cycle, the completion of 1 cycle results in deposition of about 0.4–2 monolayer of ZrHf-containing film or roughly 0.1 nm. In this example, the preferred thickness of deposited ZrHf-containing film is 50 nm, so 500 cycles of gas switching as described above are performed.

The inventive method described can be expanded to include growth of any multicomponent metal, metal oxide, metal nitride or metal silicide film deposited by atomic layer deposition utilizing two or more different precursor source mixtures or utilizing a precursor source mixture which contains two or more precursors. The inventive method described can be expanded to include growth of any multicomponent metal, metal oxide, metal nitride or metal silicide film deposited by atomic layer deposition providing at least one component of the multicomponent film is derived from a precursor source mixture. The other components of the film may be deposited utilizing conventional bubbler technology or precursor sources not covered in this invention. The inventive method described can be expanded to include growth of any single component metal, metal oxide, metal nitride or metal silicide film deposited by atomic layer deposition utilizing one precursor source mixture which contains only one precursor. In an alternative embodiment, the inert liquid is not vaporized and is diverted from the ALD reactor as described in Example 2.

EXAMPLE 4

Deposition of a Metal Silicide Film in a Atomic Layer Deposition Reactor Utilizing a Precursor Source Mixture In this example, a substrate is placed in a suitable reactor for ALD, for example the commercial F-200 reactor made by Microchemistry, and a cobalt silicide film is deposited. ALD is performed in a cyclic fashion with sequential alternating-pulses of vaporized precursor, reactant and purge gas. In this example, silane is used as the silyating agent and hydrogen as the reactant.

The cobalt-containing precursor source mixture is comprised of 50 grams of $CO_2(CO)_8$ and a liter of pentane. In this example, the precursor source mixtures are vaporized in a vaporizer and the vapor is introduced into the reactor in a cyclical fashion.

The precursor source mixtures are vaporized at 40°–260° C., preferably 40°–180° C. The substrate temperature is about 100°–1200° C., and preferably 200°–800° C. The precursor, reactant and inert purge gas ($N_2$ or Ar or other inert gas) are pulsed into the reactor in the following sequence:
1. vapor of Co-containing precursor source mixture
2. inert purge
3. hydrogen
4. inert purge
5. silane
6. inert purge
7. hydrogen
8. inert purge The precursor and reactant pulses (steps 1, and 5, and 3, and 7, respectively) last 0.1–1 second, preferably 0.5 seconds. The inert gas purge pulse (steps 2, 4, 6, and 8) last 0.2–5 seconds, preferably 2 seconds. Completion of steps 1–8 is a cycle, the completion of 0.1 cycle results in deposition of about 0.4–2 monolayer of Co silicide or roughly 0.1 nm. In this example, the preferred thickness of deposited Co silicide film is 500 nm, so 5000 cycles of gas switching as described above are performed.

The inventive method described can be expanded to include growth of any metal silicides including, but not limited to: $CoSi_2$, $HfSi_2$, $MoSi_2$, $NbSi_2$, $Pd_2Si$, PtSi, $TaSi_2$, $TiSi_2$, $VSi_2$, $WSi_2$, $ZrSi_2$ and any multicomponent metal silicide, deposited by atomic layer deposition which utilizes at least one precursor source mixture, and hydrogen or other reducing agent in sequence with silane or other silyating agent including, but not limited to: silane, dislanes, chlorosilanes, silylamines, silazanes. In an alternative embodiment, the silyating agent can be introduced in a precursor source mixture.

EXAMPLE 5

Deposition of Copper

In this example, the inventive method is used to deposit copper. A copper-containing precursor source mixture comprised of 100 grams of (cyclopentadienyl)Cu($PEt_3$), 1 gram of $PEt_3$ and 1 liter of pentane. The precursor mixture is transported to a vaporizer where the mixture is vaporized at 60° C. and the vapor transported into the chemical vapor deposition reactor where a reductant such as hydrogen is present and a copper film is deposited on a substrate heated to 100°–300° C., preferably 120°–250° C.

EXAMPLE 6

Deposition of Tungsten

In this example, the inventive method is used to deposit tungsten. The precursor source mixture is composed of 100 grams of tungsten hexacarbonyl in a liter of hexane. The precursor mixture is transported to a vaporizer where the mixture is vaporized at 80° C. and the vapor transported into the chemical vapor deposition reactor where a reductant such as hydrogen is present and a tungsten film is deposited on a substrate heated to 200°–700° C., preferably 600° C.

EXAMPLE 7

Deposition of Tantalum Nitride

In this example, the inventive method is used to deposit tantalum nitride. A tantalum containing precursor source mixture comprised of 100 grams of pentadimethylaminotantalum, 1 gram of dimethylamine and 1 liter of pentane. The precursor mixture is transported to a vaporizer where the mixture is vaporized at 60° C. and the vapor transported into the chemical vapor deposition reactor where a nitriding agent such as ammonia is present and a tantalum nitride film is deposited on a substrate heated to 200°–700° C., preferably 500° C.

EXAMPLE 8

Deposition of Indium Nitride

In this example, the inventive method is used to deposit indium nitride. An indium-containing precursor source mixture comprised of 100 grams of trimethylindium dimethylethylamine, 1 gram of dimethylethylamine and 1 liter of pentane. The precursor mixture is transported to a vaporizer where the mixture is vaporized at 60° C. and the vapor transported into the chemical vapor deposition reactor where a nitriding agent such as ammonia is present and an indium nitride film is deposited on a substrate heated to 100°–700° C., preferably 300° C.

EXAMPLE 9

Deposition of Zirconium Silicate

In this example, the inventive method is used to deposit zirconium silicate. The precursor source mixture is composed of 100 grams of zirconium tertbutoxide in liter of hexane. A second precursor source mixture is composed of 100 grams of tetraethoxysilane in liter of hexane. The precursor source mixtures are transported to a vaporizer where the mixtures are vaporized at 80° C. and the vapor transported into the chemical vapor deposition reactor where an oxidant such as oxygen is present and a zirconium silicate film is deposited on a substrate heated to 200°–700° C., preferably 500° C.

EXAMPLE 10

Fabrication of a $Al_2O_3$ Gate Dielectric for a Transistor

In this example, the inventive method is used to deposit $Al_2O_3$ to form the gate dielectric layer 15 of the PFET and NFET as shown in FIG. 1. A Si wafer substrate containing patterned structures is used. Selected regions of the substrate contain shallow trench isolation (STI) oxide located between the sites of transistor, other regions contain the field oxide, and selected regions of bare Si are exposed in the regions where transistor are to be located. The substrate is then placed in a suitable modular cluster tool, the surface of the bare Si is treated to form a $SiO_xN_y$ layer in-situ without breaking vacuum, before a layer of $Al_2O_3$ is deposited to a thickness of 1–100 nm using the CVD process of this invention. The wafer is then transported to a second module of the modular cluster tool where the gate electrode can be deposited on the $Al_2O_3$ in-situ without breaking vacuum.

For the deposition of the $Al_2O_3$ using the inventive method, the precursor source mixture is composed of 103 grams of dimethylethylamine alane and 10 grams of dimethylethylamine in a liter of hexane. The precursor mixture is transported to a vaporizer where the mixture is vaporized at 80° C. and the vapor transported into the chemical vapor deposition module of the cluster tool where an oxidant including, but not limited to: oxygen, ozone, $N_2O$, water, or mixtures thereof is present and an $Al_2O_3$ film is deposited at 200° C.

EXAMPLE 11

Fabrication of a $ZrO_2$ Gate Dielectric for a Transistor

In this example, the inventive method is used to deposit $ZrO_2$ to form the gate dielectric layer 15 of the PFET and NFET as shown in FIG. 1. A Si wafer substrate containing patterned structures is used. Selected regions of the substrate contain shallow trench isolation (STI) oxide located between the sites of transistor, other regions contain the field oxide, and selected regions of bare Si are exposed in the regions where transistor are to be located. The substrate is then placed in a suitable modular cluster tool, the surface of the bare Si is treated to form a $SiO_xN_y$ layer in-situ without breaking vacuum, before a layer of $ZrO_2$ is deposited to a thickness of 1–100 nm using the CVD process of this invention. The wafer is then transported to a second module of the modular cluster tool where the gate electrode can be deposited on the $ZrO_2$ in-situ without breaking vacuum.

For the deposition of the $ZrO_2$ using the inventive method, the precursor source mixture is composed of 100 grams of zirconium tertbutoxide in a liter of hexane. The precursor mixture is transported to a vaporizer where the mixture is vaporized at 80° C. and the vapor transported into the chemical vapor deposition module of the cluster tool where an oxidant including, but not limited to: oxygen, ozone, $N_2O$, water, or mixtures thereof is present and an $ZrO_2$ film is deposited at 400° C.

EXAMPLE 12

Fabrication of a Gate Dielectric for a Transistor

Figure 4:
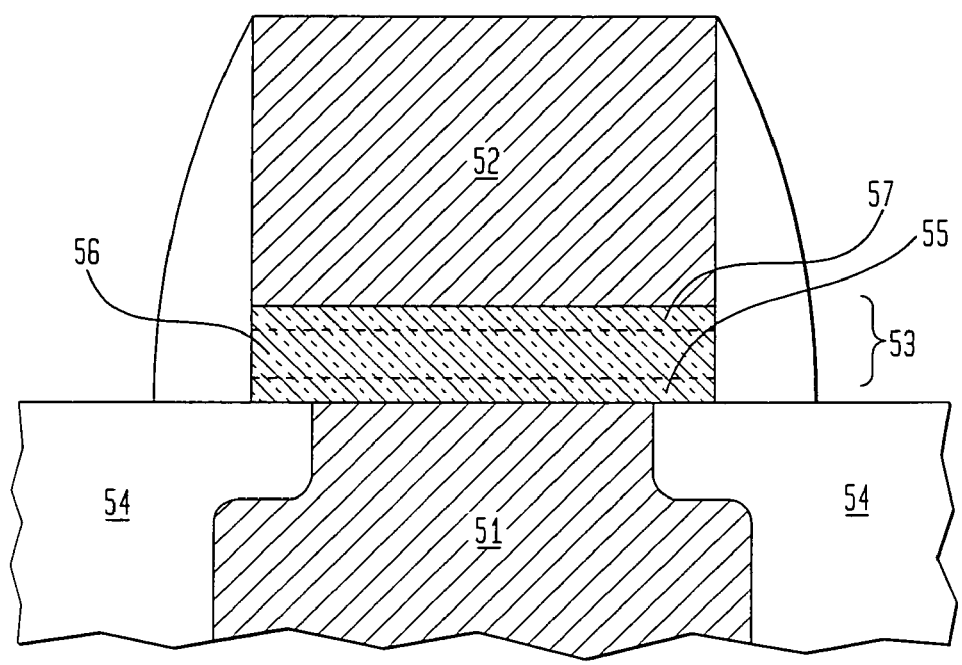
FIG. 4 is an illustration of a cross-sectional view of a transistor.

In this example, the inventive method is used to deposit the gate dielectric layer of a transistor. As shown in FIG. 4, a transistor device is formed on a conductivity region 51 and contains a gate electrode 52 formed on a gate dielectric 53 and a pair of n-type source/drain regions 54 formed on laterally opposite sides of gate electrode 52. Gate dielectric 53, which is deposited by the inventive method, may consist of doped or undoped mixtures, layers of different materials or combinations thereof. An optional upper layer 57 of gate dielectric 53 may act as a dopant diffusion barrier and stabilizes the structure during deposition of gate electrode 52. An optional lower layer 55 of gate dielectric 53 may act as an electron barrier layer and as a layer to prevent oxidation of the underlying silicon during processing or both. Middle layer 56 of gate dielectric 53 is a high K dielectric layer.

A suitable lower layer 55 is composed of dielectric materials including, but not limited to: $SiO_2$, $SiO_xN_y$, $Si_3N_4$, prepared from oxidation or nitridation of the silicon substrate or deposited separately. Other suitable lower layer materials include metal oxides or metal silicates. A middle high K dielectric layer 56 is composed of dielectric materials including, but not limited to: $Ta_2O_5$, $TiO_2$, $ZrO_2$, $HfO_2$, $Al_2O_3$, $La_2O_3$, $Y_2O_3$, yttrium alumnate, lathnaum alumnate, lanthanum silicate, yttrium silicate, hafnium silicate, zirconium silicate, doped or undoped mixtures, layers or combinations thereof. The middle layer may also be comprised of several layers of different materials such as a layer of hafnium oxide sandwiched between layers of aluminum oxide or a layer comprising a relatively homogenous mixture such as a mixture of zirconium oxide and hafnium oxide. Optional upper layer 57 may be an oxidized or nitrided surface of the middle layer, or a deposited dielectric material including, but not limited to: $SiO_2$, $SiO_xN_y$, $Si_3N_4$, $ZrO_2$, $HfO_2$, $Al_2O_3$, aluminosilicate, ytrrium silicate, zirconium silicate, hafnium silicate, lanthanum silicate doped or undoped mixtures, layers or combinations thereof. Preferred gate dielectrics are comprised of a lower layer of $SiO_xN_y$, a middle layer of $Al_2O_3$, $ZrO_2$, or $HfO_2$ and an upper barrier layer of the nitrided metal oxide. At least one of the components in gate dielectric 53 is deposited by the inventive method comprising a precursor source mixture, vaporization of the precursor source mixture and deposition of a film with the vapor in a CVD or ALD reactor.

FIGS. 5 through 12 are cross sectional views showing one preferred fabrication of a transistor using the inventive method. Fabrication of gate dielectric 53 is done in-situ in a cluster tool as manufactured by Applied Materials. In FIG. 5, a silicon substrate 50 with a clean (no native $SiO_2$) surface is the starting point. In FIG. 6, lower layer 55 has been formed by oxidation/nitridation of silicon substrate 50 to form a $SiO_xN_y$ layer. In FIG. 6, a middle layer 56 of zirconium oxide has been formed by the inventive method, comprised of utilizing a precursor source mixture of zirconium t-butoxide and hexane, vaporizing the precursor source mixture at 80° C., and deposition of a $ZrO_2$ film in the presence of an oxidant such as oxygen, ozone, $N_2O$, $H_2O$ or mixtures thereof at 400° C. on the $SiO_xN_y$ layer in a chemical vapor deposition reactor. In FIG. 7, upper layer 57 is formed by plasma nitridation of the $ZrO_2$ surface. In FIG. 8, polysilicon is deposited as gate electrode 52. In FIGS. 9 through 12, the gates are formed, extension implant done, spacers 58 formed, and source/drain implants performed to produce a fully formed devices. The subsequent steps of contact formation, etc. are not shown.

EXAMPLE 13

Fabrication of a Transistor Using Metal Gates

In this example, the inventive method is used to fabricate a transistor using metal gates. As shown in FIG. 1, a CMOS integrated circuit contains both n-type field effect transistors (NFET) and p-type field effect transistors (PFET) is formed on a single substrate 10. NFET device 11 is formed on a p-type conductivity region 13 of substrate 10 and contains a gate electrode 14 formed on a gate dielectric 15 and a pair of n-type source/drain regions 16 formed on laterally opposite sides of gate electrode 14. Similarly, PFET device 17 is formed on a n-type conductivity region 18 of substrate 10 and contains the gate electrode 19 formed on gate dielectric 15 and a pair of p-type conductivity source/drain regions 20 formed along opposite sidewalls of gate electrode 19. The NFET and PFET devices are separated by shallow trench isolation 21 and by spacers 22. In this example, the gate electrode 14 or 19 is comprised of a bulk metal or alloy having the appropriate work function. Metals suitable for the gate electrode 14 of the NFET device 11 include, but are not limited to: Al, Ag, Bi, Cd, Fe, Ga, Hf, In, Mn, Nb, Y, and Zr or alloys thereof. At least one metal suitable for the NFET may also be alloyed with W, Mo, Cr, and Cu to form gate electrode 14. Metals suitable for gate electrode 19 of PFET device 17 include, but are not limited to: Ni, Pt, Be, Ir, Te, Re and Rh. At least one metal suitable for the PFET may also be alloyed with W, Mo, Cr, and Cu to form gate electrode 19. In this embodiment, at least one of the NFET or PFET components is deposited by the inventive method including gate electrode 14, gate electrode 19 and/or gate dielectric 15. The gate dielectric 15 may be deposited by the inventive method as described in example 2.

EXAMPLE 14

Fabrication of a Transistor

Figure 13:
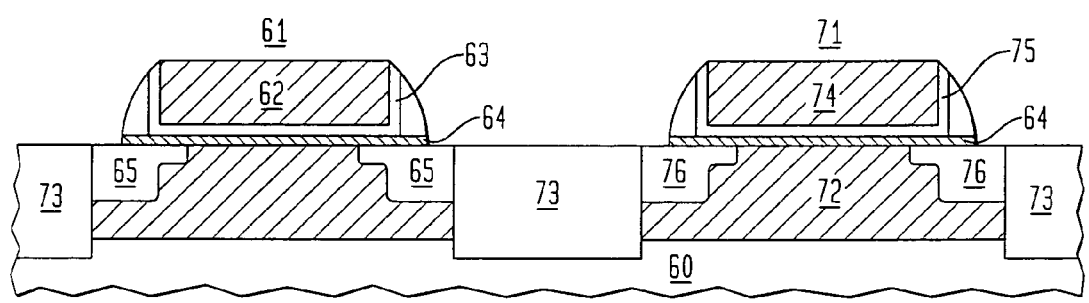
FIG. 13 is an illustration of a cross-sectional view of a transistor.

In this example, the inventive method is used to fabricate a transistor using metal gates. FIG. 13 shows a generic device structure including NFETs and PFETs. In this embodiment NFET and PFET are formed on a single p-type conductive substrate 60. NFET device 61 is formed on a p-type conductivity region of substrate 60 and contains a gate electrode 62 formed on a gate dielectric 64 and a pair of n-type source/drain regions 65 formed on laterally opposite sides of gate electrode 62. Similarly, PFET device 71 is formed on a n-type well 72 of substrate 60 isolated by shallow trench isolation 73 and contains the gate electrode 74 formed on gate dielectric 64 and a pair of p-type conductivity source/drain regions 76 formed along opposite sidewalls of gate electrode 74.

Figure 14:
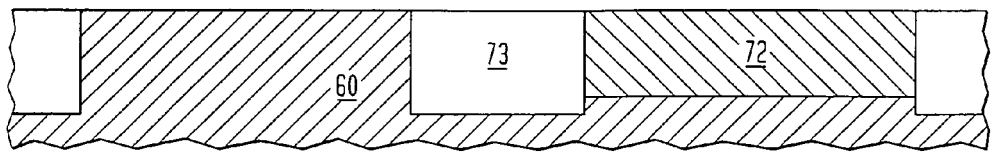
FIGS. 14–23 are illustrations of a cross-sectional view of the fabrication of a transistor.
Figure 15:
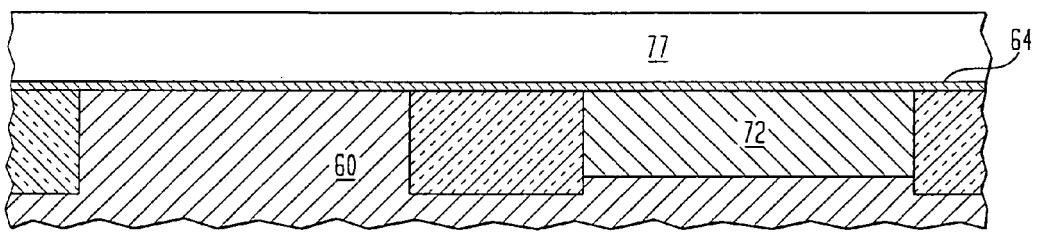
Figure 16:
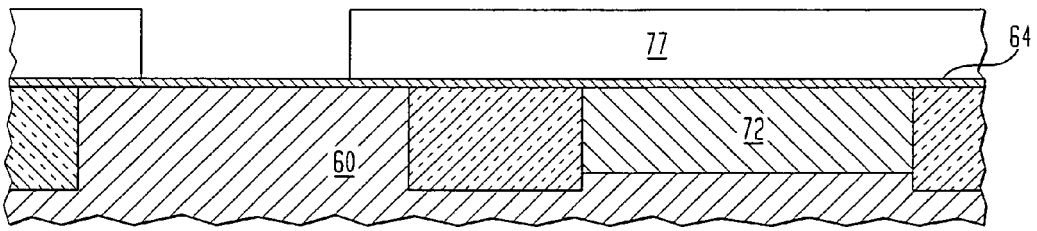
Figure 17:
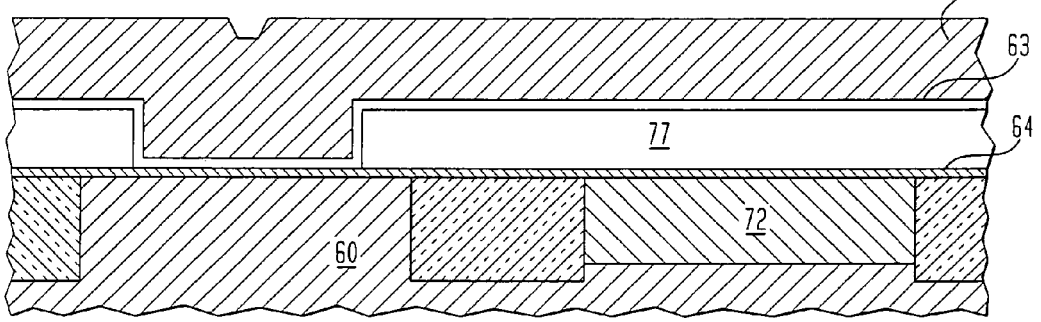
Figure 18:
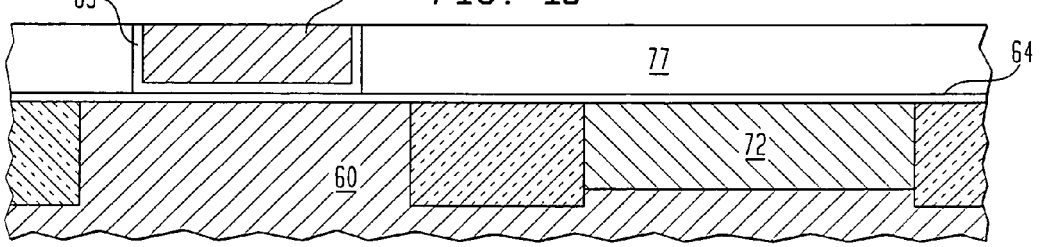
Figure 19:
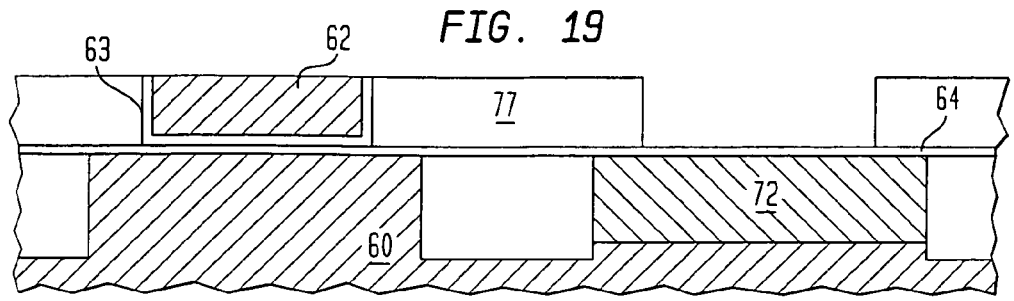
Figure 20:
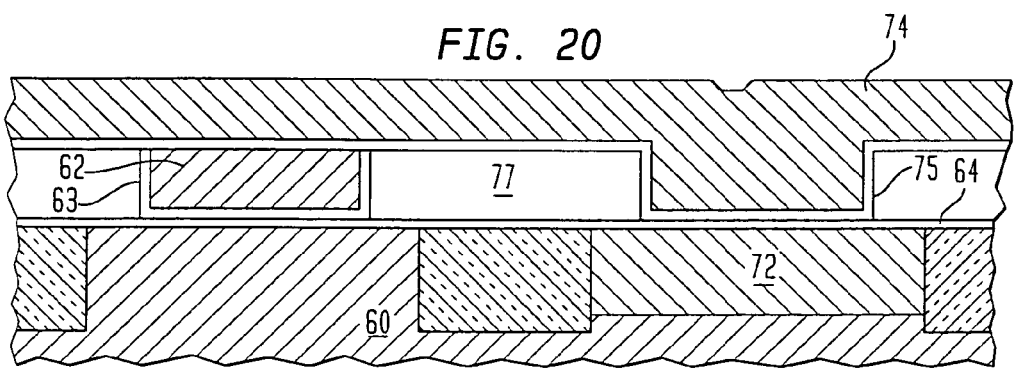
Figure 21:
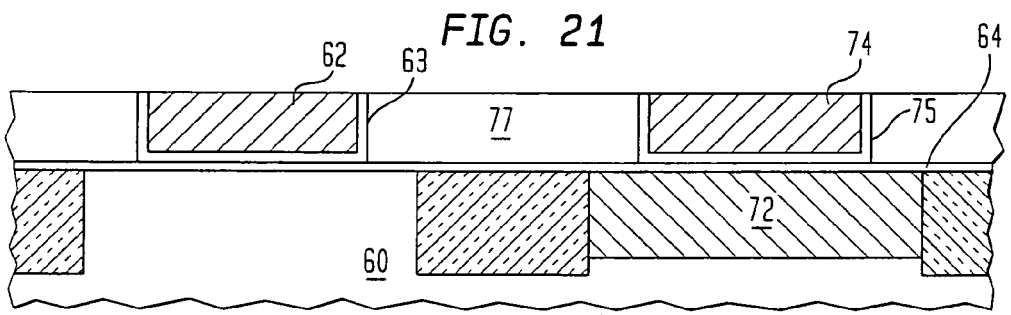
Figure 22:
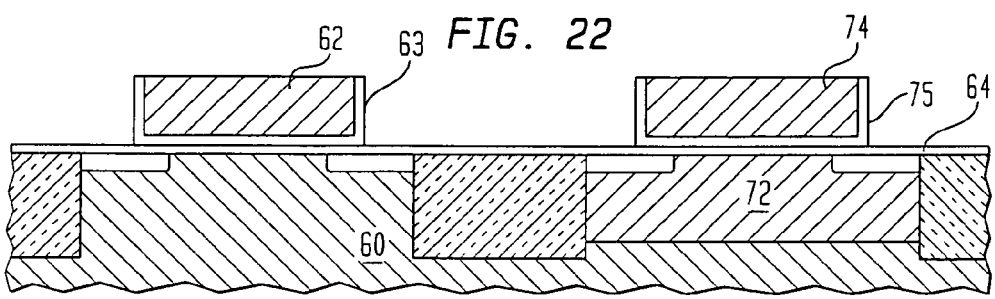
Figure 23:
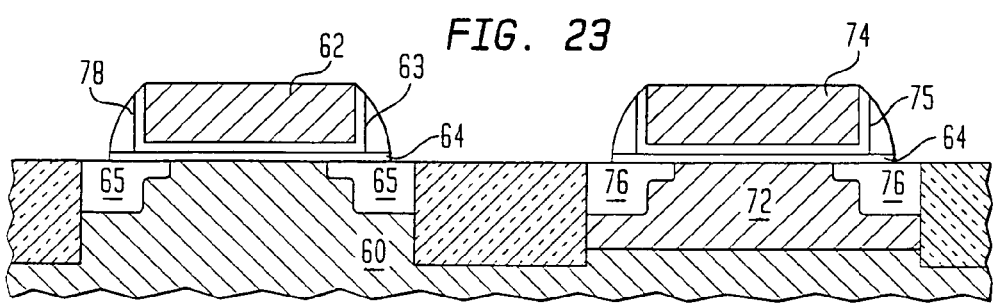

FIGS. 14 through 23 are partial cross sectional views showing one example of a possible fabrication sequence for a standard CMOS flow. In FIG. 14, a silicon substrate 60 having shallow trench isolation (STI) 73 and an N-well 72 are formed in a portion of a p-type conductive substrate. In FIG. 15, a gate dielectric 64 and a masking layer (for example $Si_3N_4$) 77 have been formed on the substrate. Gate dielectric 64 may be deposited according to the inventive method as described in examples 12. In FIG. 16, an opening in masking layer 77 where the NFET gate will go has been formed. In FIG. 17, NFET gate electrode 62 has been formed. Materials suitable for NFET gate electrode 62 include, but are not limited to: polysilicon, W, Mo, Ti, Cr, Cu, Fe, Mn, Nb, V, Re, Pt, Ag, Bi, Cd, Fe, Ga, Hf, In, Mn, Y, Zr doped or undoped alloys, mixtures and multilayers, thereof. NFET gate electrode 62 may be deposited by the inventive method. In FIG. 18, a chemical-mechanical-polish (CMP) step has be done to planarize the surface. In FIGS. 19 through 21 steps are shown which repeat those in FIGS. 16–18 for the PFET device fabrication. In FIG. 19, an opening in masking layer 77 where the PFET gate will go has been formed. In FIG. 20, PFET gate electrode 74 has been formed. Materials suitable for gate electrode 74 for PFET include, but not limited to: polysilicon, Ni, W, Mo, Ti, Cr, Te, Cu, Pd, Pt, Be, Au, Ir, Te, Rh, doped or undoped alloys, mixtures and multilayers, thereof. PFET gate electrode 74 may be deposited by the inventive method. In FIG. 21, a chemical-mechanical-polish (CMP) step has be done to planarize the surface. In FIG. 22, extension implants are performed, one for the NFET, and one for the PFET, each through a blocking layer. In FIG. 23, source/drain implants are performed, after a spacer 78 formation process, one for the NFET, and one for the PFET, each through a blocking layer to complete device fabrication. In this embodiment, at least one or more of the layers or component of a layer, including the gate dielectric, gate electrode, is deposited by the inventive method comprising a precursor source mixture, vaporization of the precursor source mixture and deposition of a film using the vapor of the precursor source mixture in a CVD or ALD reactor.

EXAMPLE 15

Fabrication of a Stack Capacitor

In this example, an integrated circuit capacitor is fabricated incorporating at least one component deposited by the inventive method. As shown in FIG. 2, a typical capacitor is formed on a substrate 30, connected by a plug 31 to a transistor, with a barrier 32 and consists of a bottom electrode 33, a dielectric material 34 which may or may not be ferroelectric, and a top electrode 35. In this embodiment at least one of the capacitor components is deposited by the inventive method including plug 31, barrier 32, bottom electrode 33, a dielectric material 34 and/or top electrode 35.

Figure 24:
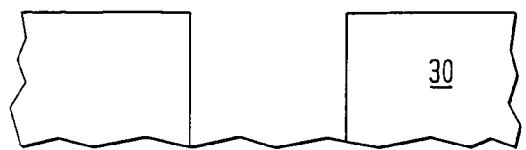
FIGS. 24–28 are illustrations of a cross-sectional view of the fabrication of a stack capacitor.
Figure 25:
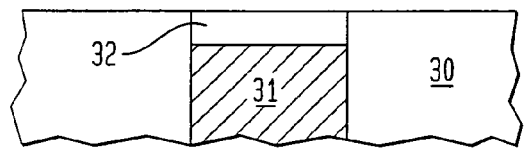
Figure 26:
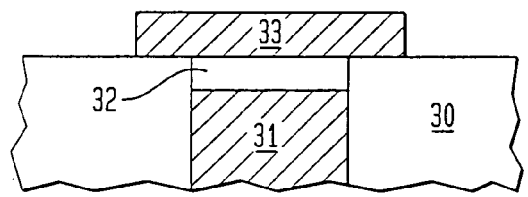
Figure 27:
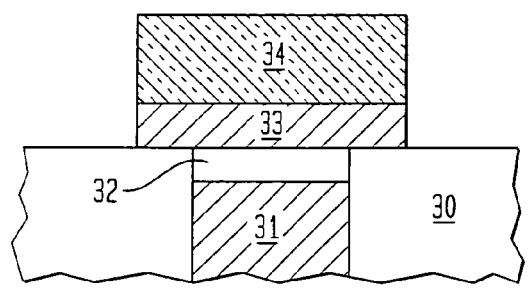
Figure 28:
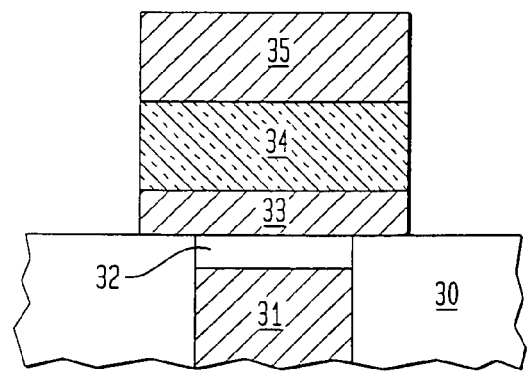

FIGS. 24 through 28 are partial cross sectional views showing one example of a possible fabrication sequence for a capacitor. In FIG. 24, a substrate 30 having a trench is formed. Substrates include, but are not limited to: Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof. In FIG. 25, a plug material 31 and an optional barrier 32 is formed. The plug material is composed of conventional conductive materials including, but not limited to: polysilicon, W, Mo, Ti, Cr, Cu, and may deposited utilizing the inventive method. Optional conductive barrier 32 is composed of conventional conductive materials including, but not limited to: TaN, TaSiN, TiAlN, TiSiN, TaSiN, TaWN, TiWN, TaSiN, TaAlN, NbN, ZrN, TaTiN, TiSiN, TiAlN, $IrO_2$, SiC, TiPt, TiNPt, TiAlN-Pt, Ru, $RuO_2$, RuPt, $RuO_2$, WSi, Ti, TiSi, doped and undoped polysilicon, Al, Pd, Ir, $IrO_x$, Os, OsOX, MoSi, TiSi, $ReO_2$, mixtures or multilayers thereof and may be deposited utilizing the inventive method. In FIG. 26, a bottom electrode 33 is formed. The bottom electrode is composed of conductive materials including, but not limited to: polysilicon, Ni, Pd, Pt, Cu, Ag, Au, Ru, Ir, Rh, $IrO_x$, $RuO_x$, TaN, TaSiN, Ta, $SrRuO_3$, $LaSrCoO_3$, doped or undoped alloys, mixtures, or multilayers, thereof. In FIG. 27, a dielectric material 34 is formed. The dielectric material is composed of any insulating material including, but not limited to: $SiO_2$, $SiO_xN_y$, $Si_3N_4$, metal oxides such as $Ta_2O_5$, $TiO_2$, $ZrO_2$, $HfO_2$, $Al_2O_3$, $La_2O_3$, $Y_2O_3$ alloys, mixtures or layers thereof, or multicomponent metal oxides such as pervoskite type oxides having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include, but are not limited to: barium strontium titanate, zirconate, hafnate, lead titanate, yttrium alumnate, lanthanum alumnate, lead zirconium titanate, silicates such as hafnium silicate, zirconium silicate including rare earth doped silicates. In FIG. 28, a top electrode 35 is formed. The top electrode is composed of conductive materials including, but not limited to: polysilicon, Ni, Pd, Pt, Cu, Ag, Au, Ru, Ir, Rh, $IrO_x$, $RuO_x$, TaN, TaSiN, Ta, $SrRuO_3$, $LaSrCoO_3$, doped or undoped alloys, mixtures, or multilayer, thereof. The top and bottom electrode may or may not be similar. In this embodiment, at least one or more of the layers, including the plug, barrier, bottom electrode, dielectric, and/or top electrode is deposited by the inventive method comprising a precursor source mixture, vaporization of the precursor source mixture and deposition of a film using the vapor of the precursor source mixture in a CVD or ALD reactor.

EXAMPLE 16

Fabrication of a Trench Capacitor

Figure 30:
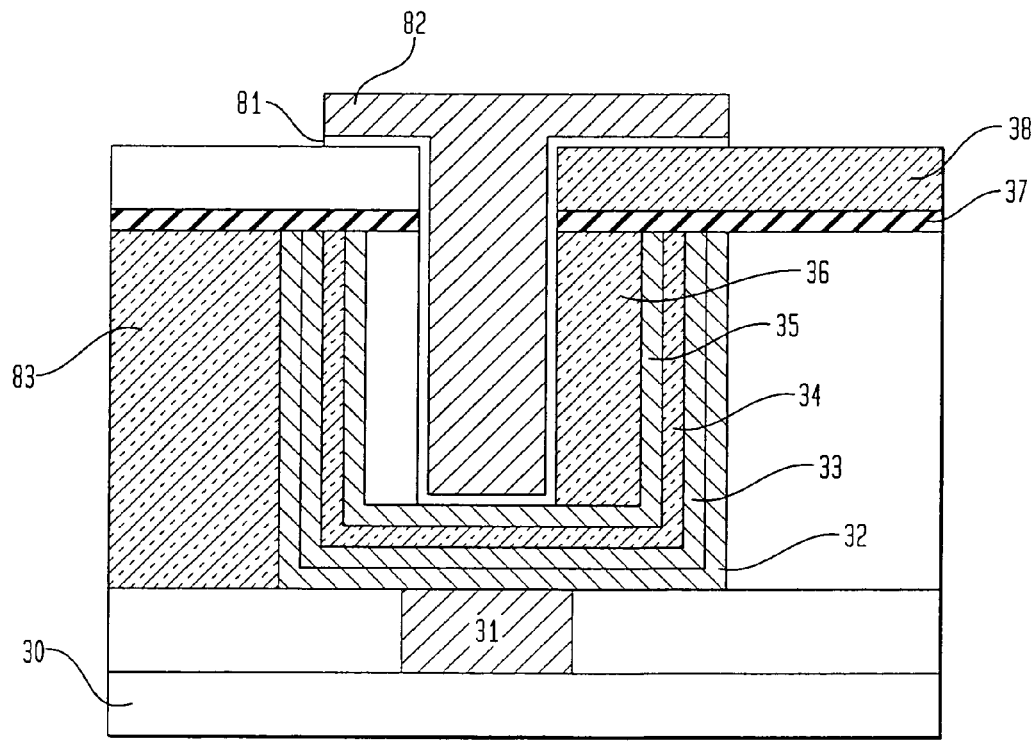
FIG. 30 is an illustration of a cross-sectional view of a trench capacitor.

In this example, an integrated circuit trench capacitor is fabricated incorporating at least one component deposited by the inventive method. One possible example for fabricating a trench capacitor on a substrate 30 is shown in FIG. 30. A capacitor recess is formed in the substrate 30 which is connected to underlying circuitry via plug 31. The circuitry is covered with a dielectric insulating layer (isolation dielectric) 83. Substrates include, but are not limited to Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof. Dielectric insulating layer (isolation dielectric) 83 is selected from any insulating material including, but not limited to: $SiO_2$, $SiO_xN_y$, $Si_3N_4$, phosphosilicate glass, or metal oxides such as $Al_2O_3$ doped or undoped mixtures, or multilayer, thereof. Over the plug and the capacitor recess is deposited in sequence, an optional conductive barrier layer 32, bottom electrode layer 33, dielectric layer 34, and a top electrode layer 35, and optional dielectric buffer layer 36. The plug material is composed of conventional conductive materials including, but not limited to: polysilicon, W, Mo, Ti, Cr, Cu, and may deposited utilizing the inventive method. Optional conductive barrier 32 is composed of conventional conductive materials including, but not limited to: TaN, TaSiN, TiAlN, TiSiN, TaSiN, TaWN, TiWN, TaSiN, TaAlN, NbN, ZrN, TaTiN, TiSiN, TiAlN, $IrO_2$, SiC, TiPt, TiNPt, TiAlN-Pt, Ru, $RuO_2$, RuPt, $RuO_2$, WSi, Ti, TiSi, doped and undoped polysilicon, Al, Pd, Ir, $IrO_x$, Os, $OSO_x$, MoSi, TiSi, $ReO_2$, mixtures or multilayers thereof and may be deposited utilizing the inventive method. Bottom electrode 33 is composed of conductive materials including, but not limited to: polysilicon, Ni, Pd, Pt, Cu, Ag, Au, Ru, Ir, Rh, $IrO_x$, $RuO_x$, TaN, TaSiN, Ta, $SrRuO_3$, $LaSrCoO_3$, doped or undoped alloys, mixtures, or multilayers thereof. Dielectric material 34 is composed of any insulating material including, but not limited to: $SiO_2$, $SiO_xN_y$, $Si_3N_4$, metal oxides such as $Ta_2O_5$, $TiO_2$ $ZrO_2$, $HfO_2$, $Al_2O_3$, $La_2O_3$' $Y_2O_3$ alloys, mixtures or layers thereof, or multicomponent metal oxides such as pervoskite type oxides having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include, but are not limited to: barium strontium titanate, zirconate, hafnate, lead titanate, yttrium alumnate, lanthanum alumnate, lead zirconium titanate, silicates such as hafnium silicate, zirconium silicate including rare earth doped silicates. Top electrode 35 is composed of conductive materials including, but not limited to: polysilicon, Ni, Pd, Pt, Cu, Ag, Au, Ru, Ir, Rh, $IrO_x$, $RuO_x$, TaN, TaSiN, Ta, $SrRuO_3$, $LaSrCoO_3$, doped or undoped alloys, mixtures, or multilayer, thereof. The top and bottom electrode may or may not be similar. The optional dielectric barrier is composed of any insulating material including, but not limited to: $SiO_2$, $SiO_xN_y$, $Si_3N_4$, TiON, AlN, SiN, TiN, metal oxides such as $Ta_2O_5$, $TiO_2$, $ZrO_2$, $HfO_2$, $Al_2O_3$, $La_2O_3$, $Y_2O_3$, alloys, mixtures or layers thereof, or multicomponent metal oxides. The sequentially deposited layers are planarized to yield a trench capacitor in the capacitor recess. An insulating passivation layer 37 and an inter-layer dielectric layer 38 are deposited to form a barrier structure over the trench capacitor in the capacitor recess. Insulating passivation layer 37 is composed of any insulating material including, but not limited to: $SiO_2$, $SiO_xN_y$, $Si_3N_4$, TiON, AlN, SiN, TiN, metal oxides such as $Ta_2O_5$, $TiO_2$, $ZrO_2$, $HfO_2$, $Al_2O_3$, $La_2O_3$, $Y_2O_3$, alloys, mixtures or layers thereof, or multicomponent metal oxides. Inter-layer dielectric 38 is selected from any insulating material including, but not limited to: $SiO_2$, $SiO_xN_y$, $Si_3N_4$, phosphosilicate glass, or metal oxides such as $Al_2O_3$ doped or undoped mixtures, or multilayers, thereof. A via is formed in the barrier structure. A diffusion barrier layer 81 and a metallazation layer 82 is deposited over the barrier structure and via. Diffusion barrier layer 81 includes, but not limited to: WN, TiN, or TaN. Metallazation layer 82 is selected from any conductive material including, but not limited to: Al, W, Mo, Ti, Cr, or Cu doped or undoped alloys, mixtures, or layers thereof. In this embodiment, at least one of the trench capacitor components including, but not limited to: conductive barrier material, bottom electrode, dielectric material, top electrode, insulating passivation layer, inter-layer dielectric, diffusion barrier layer, isolation dielectric, and metallization layer is deposited by the inventive method.

EXAMPLE 17

Fabrication of a Wiring Structure

In this example, an integrated circuit wiring structure is fabricated incorporating at least one component deposited by the inventive method. As shown in FIG. 3a, a typical wiring structure is formed by etching trenches 41 and vias 42 into a dielectric layer 43 selected from any insulating material including, but not limited to: $SiO_2$; $SiO_xN_y$, $Si_3N_4$, phosphosilicate glass, or metal oxides such as $Al_2O_3$ doped or undoped mixtures, or multilayers, thereof. The metallization layer may be patterned by a damascene or a dual damascene process or by lithography and etching. Below dielectric layer 43 is a metal thin film wire 44, selected from any conductive material including, but not limited to: Al, W, Mo, Ti, Cr, or Cu alloys, mixtures, or layers thereof, and a dielectric layer 45 selected from any insulating material including, but not limited to: $SiO_2$, $SiO_xN_y$, $Si_3N_4$, phosphosilicate glass, or metal oxides such as $Al_2O_3$ doped or undoped mixtures, or multilayer, thereof. In FIG. 3b, the trench and via are filled with a barrier material 46, including, but not limited to: WN, TiN, or TaN and a wiring metal 47 selected from any conductive material including, but not limited to: Al, W, Mo, Ti, Cr, or Cu doped or undoped alloys, mixtures, or layers thereof. In this embodiment, at least one of the wiring structure components is deposited by the inventive method including dielectric layer, metal thin film wire, barrier material, and/or wiring metal.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the

Having thus described our invention in detail, what we claim is new, and desire to secure by the Letters Patent is:

1. A precursor source mixture utilized for chemical vapor deposition or atomic layer deposition comprising at least one precursor compound which is dissolved, emulsified or suspended in an inert organic liquid, where said precursor compound is a precursor metal atom bound to a ligand selected from the group consisting of hydride, carbonyl, imido, hydrazido, phosphido, nitrosyl, nitryl, nitrate, nitrite, halide, azide, siloxy, and silyl, with the proviso that the precursor compound is not an alkylamine alane, MeAu(PMe$_3$), or (Me$_3$P)Cu(tertbutoxy), tantalum cyclopentadienyl hydride, copper bound to a β-diketonate, β-diiminate, β-diketiminate, and the proviso that the precursor compound is not bound to a diketoamido (RC(O)NC(O)CR), imidoylamidinato (RC(NH)NC(NH)CR), ketimidoylamidinato RC(O)NC(NH)CR, or hydrocarbyl C(R$_2$)C(CH$_3$)$_2$C(R$_2$)N(R$_2$) ligand, wherein R is a hydrocarbon and the proviso that the precursor metal atom is not Pt and with the proviso that when the precursor metal atom is Ru and said ligand is a carbonyl, then the precursor is selected from the group consisting of Ru$_3$CO$_{12}$ and Ru$_3$(CO)$_{12}$.

2. The precursor source mixture of claim 1 wherein said inert organic liquid is an aliphatic hydrocarbon, aromatic hydrocarbon, alcohol, ether, aldehyde, ketone, acid, phenol, ester, alkylnitrile, halogenated hydrocarbon, silyated hydrocarbon, thioether, amine, cyanate, isocyanate, thiocyanate, silicone oil, nitroalkyl, alkylnitrate, or mixtures thereof.

3. The precursor source mixture of claim 1 wherein said inert organic liquid vaporizes at a higher temperature than said at least one precursor compound.

4. The precursor source mixture of claim 2 wherein said inert organic liquid is a C$_{5-12}$ alkane.

5. The precursor source mixture of claim 1 wherein said inert organic liquid contains an additive of no more than 30% by volume of the inert organic liquid.

6. The precursor source mixture of claim 5 wherein said additive is an additional precursor ligand, an additional precursor adduct, or other coordinating compound selected from the group consisting of phosphines, phosphites, aryls, amines, arsines, stibenes, ethers, sulfides, nitrites, isonitriles, alkenes, pyridines, heterocycles, tetrahydrofuran, dimethylformamide, marcrocycles, schiff bases, cycloalkenes, alcohols, phosphine oxides and alkynes.

7. The precursor source mixture of claim 5 wherein the additive is selected from the group consisting of methanol, ethanol, isopropanol, neopentanol, trimethylamine, dimethylethylamine, diethylmethylamine, triethylamine, dimethylamine, diethylamine, bistrimethylsilylamine, ammonia, ethylenediamine, propylenediamine, trimethylethylethylenediamine, triphenylphosphine, triethylphosphine, trimethylphosphine, allyl, cyclopentadiene, benzene, ethylbenzene, toluene, cyclohexadiene, cyclooctadiene, cycloheptatriene, cyclooctatetraene, mesitylene, tertrahydrofuran, dimethylformamide, dimethylsulfoxide, butyl acetate, acetic acid, ethylhexanoic acid, methane, ethane, pyridine, and PF$_3$.

8. The precursor source mixture of claim 1 wherein the inert organic liquid is composed of two or more components selected from the group consisting of aliphatic hydrocarbons, aromatic hydrocarbons, alcohols, ethers, aldehydes, ketones, acids, phenols, esters, amines, alkylnitrile, halgonated hydrocarbons, silyated hydrocarbons, thioethers, amines, cyanates, isocyanates, thiocyanates, silicone oils, nitroalkyl, alkylnitrate, and/or mixtures of one or more of the above and an additive of no more than 30% by volume of the inert organic liquid wherein the additive is selected from the group consisting of additional precursor ligand, additional precursor adduct, and other coordinating compound selected from the group consisting of phosphines, phosphites, aryls, amines, arsines, stibenes, ethers, sulfides, nitriles, isonitriles, alkenes, pyridines, heterocycles, tetrahydrofuran, dimethylformamide, marcrocycles, schiff bases, cycloalkenes, alcohols, phosphine oxides, and alkynes.

9. The precursor source mixture of claim 8 wherein the additive is selected from the group consisting of methanol, ethanol, isopropanol, neopentanol, trimethylamine, dimethylethylamine, diethylmethylamine, triethylamine, dimethylamine, diethylamine, bistrimethylsilylamine, ammonia, ethylenediamine, propylenediamine, trimethylethylethylenediamine, triphenylphosphine, triethylphosphine, trimethylphosphine, allyl, cyclopentadiene, benzene, ethylbenzene, toluene, cyclohexadiene, cyclooctadiene, cycloheptatriene, cyclooctatetraene, mesitylene, tetrahydrofuran, dimethylformamide, dimethylsulfoxide, butyl acetate, acetic acid, ethylhexanoic acid, methane, ethane, pyridine, and PF$_3$.

10. The precursor source mixture of claim 1 wherein the inert organic liquid is composed of C$_5$–C$_{12}$ alkane and contains an additive of no more than 30% by volume of the inert organic liquid wherein the additive is selected from the group consisting of an additional precursor ligand, an additional precursor adduct, or other coordinating compound selected from the group consisting of phosphines, phosphites, aryls, amines, arsines, stibenes, ethers, sulfides, nitriles, isonitriles, alkenes, pyridines, heterocycles, tetrahydrofuran, dimethylformamide, macrocycles, schiff bases, cycloalkenes, alcohols, phosphine oxides, and alkynes.

11. The precursor source mixture of claim 10 wherein the additive is methanol, ethanol, isopropanol, neopentanol, trimethylamine, dimethylethylamine, diethylmethylamine, triethylamine, dimethylamine, diethylamine, bistrimethylsilylamine, ammonia, ethylenediamine, propylenediamine, trimethylethylethylenediamine, triphenylphosphine, triethylphosphine, trimethylphosphine, allyl, cyclopentadiene, benzene, ethylbenzene, toluene, cyclohexadiene, cyclooctadiene, cycloheptatriene, cyclooctatetraene, mesitylene, tetrahydrofuran, dimethylformamide, dimethylsulfoxide, butyl acetate, acetic acid, ethylhexanoic acid, methane, ethane, pyridine, or PF$_3$.

12. A method for chemical vapor deposition or atomic layer deposition comprising: vaporizing the precursor compound in the precursor source mixture of claim 1, introducing the vaporized precursor into a chemical vapor deposition or atomic layer deposition reactor with optional addition of other co-reactant(s), and depositing a constituent of the vaporized precursor on a substrate to form a film.

13. The method of claim 12 wherein said film is a component in an electronic device.

14. The method of claim 12 wherein said co-reactant(s) is introduced separately from said vaporized precursor.

15. The method of claim 12 comprising vaporizing the precursor in the precursor source mixture, and introducing the vaporized precursor into an atomic layer deposition reactor with separate addition of other co-reactant(s) and inert purge gas and depositing a film on a substrate by sequential introduction of alternating pulses of vaporized precursor(s), purge gas, co-reactant(s) and purge gas.

16. The method of claim 12 wherein the co-reactant is a reducing agent, an oxidizing agent, a nitriding agent or a silyating agent.

17. The method of claim 16 wherein said co-reactant is a reducing agent selected from the group consisting of hydrogen, forming gas, silane, and combinations thereof.

18. The method of claim 16 wherein said co-reactant is an oxidizing agent selected from the group consisting of oxygen, ozone, water, hydrogen peroxide, nitrous oxide, and combinations thereof.

19. The method of claim 16 wherein said co-reactant is a nitriding agent selected from the group consisting of ammonia, hydrazine, hydrogen azide, tertbutylamine, isopropylamine, and combinations thereof.

20. The method of claim 16 wherein said co-reactant is a silyating agent selected from the group consisting of silane, dislanes, chlorosilanes, silylamines, silazanes, and combinations thereof.

21. The method of claim 12 comprising subjecting said substrate to a sequence of alternating pulses of three or more different gases wherein one of said gases comprises vaporized precursor of said precursor source mixture, another of said gases is a purge gas and another of said gases is a reducing agent.

22. The method of claim 12 comprising subjecting said substrate to a sequence of alternating pulses of three or more different gases wherein one of said gases comprising said vaporized precursor of said precursor source mixture, another of said gases is a purge gas and another of said gases is an nitriding agent.

23. The method of claim 12 comprising subjecting said substrate to a sequence of alternating pulses of four or more different gases, wherein one of said gases comprises said vaporized precursor of said precursor source mixture, another of said gases is a purge gas, another of said gases is an oxidizing agent and another of said gases is selected from the group consisting of any vaporized precursor and a vaporized precursor of said precursor source mixture.

24. The method of claim 12 comprising subjecting said substrate to a sequence of alternating pulses of four or more different gases, wherein one of said gases comprises vaporized precursor of said precursor source mixture, another of said gases is a purge gas, another of said gases is an nitriding agent and another of said gases is selected from the group consisting of any vaporized precursor and a vaporized precursor of said precursor source mixture.

25. The method of claim 12 comprising subjecting said substrate to a sequence of alternating pulses of four or more different gases, wherein one of said gases comprises vaporized precursor of said precursor source mixture, another of said gases is a purge gas, another of said gases is a reducing agent and another of said gases is selected from the group consisting of any vaporized precursor and a vaporized precursor of said precursor source mixture.

26. The method of claim 12 comprising subjecting said substrate to a sequence of alternating pulses of five or more different gases, wherein one of said gases comprises vaporized precursor of said precursor source mixture, another of said gases is a purge gas, another of said gases is a reducing agent and another of said gases is selected from the group consisting of any Si containing vaporized precursor and a Si containing vaporized precursor of said precursor source mixture.

27. The method of claim 12 wherein the substrate is selected from the group consisting of semiconductor substrates, dielectrics, metals, organic substrates, glasses, metal oxides, and plastic polymeric substrates, Si-containing semiconductor substrates, ceramics, silicon-on-insulator substrates, Ge substrates, SiGe substrates, GaAs substrates, and mixtures or multilayers thereof.

28. The method of claim 13 wherein said electronic device is a transistor, capacitor, diode, resistor, switch, light emitting diode, laser, wiring structure, or interconnect structure.

29. A method of fabricating a stack or trench capacitor structure composed of a bottom electrode, a dielectric layer, a top electrode layer and an optional dielectric buffer layer over said capacitor which is connected to underlying circuitry via a plug and optional barrier wherein at least one component of the capacitor structure is deposited according to claim 12.

30. The method of claim 29 wherein the optional dielectric barrier is selected from the group consisting of $SiO_2$, $SiO_xN_y$, $Si_3N_4$, TiON, AlN, SiN, TiN, $Ta_2O_5$, $TiO_2$, $ZrO_2$, $HfO_2$, $Al_2O_3$, $La_2O_3$, $Y_2O_3$, alloys, mixtures or layers thereof, and multicomponent metal oxides.

31. The method of claim 29 wherein the dielectric is a ferroelectric material.

32. The method of claim 29 wherein the plug material is selected from the group consisting of polysilicon, W, Mo, Ti, Cr, Cu, and doped or undoped alloys, mixtures and multilayers thereof.

33. The method of claim 29 wherein the conductive barrier is selected from the group consisting of TaN, TaSiN, TiAlN, TiSiN, TaWN, TiWN, NbN, ZrN, TaTiN, IrOx, Os, OsOx, MoSi, TiSi, $ReO_2$, and doped or undoped alloys, mixtures and multilayers thereof.

34. The method of claim 29 wherein the bottom electrode is selected from the group consisting of conductive materials, polysilicon, Ni, Pd, Pt, Cu, Ag, Au, Ru, Ir, Rh, OrOx, TaN, TaSiN, Ta, $SrRuO_3$, $LaSrCO_3$, and doped or undoped alloys, mixtures and multilayers thereof.

35. The method of claim 29 wherein the dielectric material is selected from the group consisting of $SiO_2$, $SiO_xN_y$, $Si_3N_4$, $Ta_2O_5$, $TiO_2$, $ZrO_2$, $HfO_2$, $Al_2O_3$, $La_2O_3$, $Y_2O_3$, multicomponent metal oxides, pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3, barium strontium titanate, barium strontium zirconate, barium strontium hafnate, lead titanate, yttrium alumnate, lanthanum alumnate, lead zirconium titanate, strontium bismuth tantalate, strontium bismuth niobate, bismuth titanate, lanthanum silicate, yttrium silicate, hafnium silicate, zirconium silicate, rate earth doped silicates and doped or undoped alloys, mixtures and multilayers thereof.

36. The method of claim 29 wherein the top electrode is selected from the group consisting of polysilicon, Ni, Pd, Pt, Cu, Ag, Au, Ru, Ir, Rh, IrOx, TaN, TaSiN, Ta, $SrRuO_3$, $LaSrCoO_3$, and doped or undoped alloys, mixtures and multilayers thereof.

37. A method of fabricating a wiring structure composed of etched trenches and vias into a dielectric layer, optional barrier material between dielectric and wiring material, and wiring material wherein at least one component of the wiring structure is deposited according to claim 12.

38. The method of claim 37 wherein the dielectric layer is selected from the group consisting of $SiO_2$, $SiO_xN_y$, $Si_3N_4$, phosphosilicate glass, metal oxides, $Al_2O_3$ and doped or undoped alloys, mixtures and multilayers thereof.

39. The method of claim 37 wherein the optional barrier material is selected from the group consisting of WN, TiN, TaN, $SiO_2$, $SiO_xN_y$, $Si_3N_4$, phosphosilicate glass, metal oxides, $Al_2O_3$, and doped or undoped alloys, mixtures and multilayers thereof.

40. The method of claim 37 wherein the wiring material is selected from the group consisting of polysilicon, Al, W, Mo, Ti, Cr, Cu and doped or undoped alloys, mixtures and multilayers thereof.

41. A method of fabricating an electronic device composed of a substrate having source and drain regions and a channel region between said source and drain regions, a gate dielectric, aligned to and on top of said channel region, and a gate electrode aligned to and on top of said gate dielectric wherein at least one component of the electronic device is deposited according to claim 12.

42. A method of claim 41 wherein the gate dielectric selected from the group consisting of $SiO_2$, $SiO_xN_y$, $Si_3N_4$, $Ta_2O_5$, $TiO_2$, $ZrO_2$, $HfO_2$, $Al_2O_3$, $La_2O_3$, $Y_2O_3$, multicomponent metal oxides, pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3, barium strontium titantate, barium strontium zirconate, barium strontium hafnate, lead titanate, yttrium alumnate, lanthanum alumnate, lead zirconium titanate, strontium bismuth tantalate, strontium bismuth niobate, bismuth titanate, lanthanum silicate, yttrium silicate, hafnium silicate, zirconium silicate, rare earth doped silicates and doped or undoped alloys, mixtures and multilayers thereof.

43. The method of claim 41 wherein gate dielectric is composed of more than one layer.

44. The method of claim 41 wherein the gate electrode is selected from the group consisting of polysilicon, Al, Ag, Bi, Cd, Fe, Ga, Hf, In, Mn, Nb, Y, Zr, Ni, Pt, Be, Ir, Te, Re, Rh, W, Mo, Cr, Fe, Pd, Au, Rh, Ti, Cr, Cu, and doped or undoped alloys, mixtures and multilayers thereof.

45. The precursor source mixture of claim 1 wherein the at least one precursor compound is B, Al, Ga, In, As or Sb, hydride, chloride, fluoride, bromide, iodide, Cp or azide; $Mo(CO)_3$; $Fe(CO)_5$; $CO_2(CO)_8$; $Os_3CO_{12}$; $Cr(CO)_6$; $Mn_2(CO)_{10}$; $Mo(CO)_6$; $Ni(CO)_4$; $Re_2(CO)_{10}$; $Ru_3(CO)_{12}$; $W(CO)_6$; $CF_3Co(CO)_4$; $(CO)_4Fe[P(OCH_3)_3]$; $(CO)_4Fe[N(CH_3)_3]$; $CoNO(CO)_3$; $OSi(CH_3)_3$ Li, Na, K, Rb, Cs, Fr, Cu, Ag, Au, Hg, or Tl; tetra-$OSi(CH_3)_3$ Si, Ge, Sn, Pb, Ti, Zr, or Hf; tri-$OSi(CH_3)_3$, B, Al, Ga, In, P, As, or Sb; diethylaminoarsine dichloride; bisdimethylaminoasine chloride; $(CO)_4Fe[N(CH_3)_3]$, Li, Na, or K $N(SiMe_3)$, $CpCu(PEt_3)$; CpCu (triphenylphosphine); $Ni(PF_3)_4$; $Cr(PF_3)_6$; $(Et_3P)_3Mo(CO)_3$; $Ir(PF_3)_4$; $Ti(NO_3)_4$; $Zr(NO_3)_4$; $Hf(NO_3)_4$; $Si(CH_3)_3(NO_3)$; $RuNO(NO_3)_3$; gallium nitrate; $Sn(NO_3)_4$; $Co(NO_3)_3$; $VO(NO_3)_3$; $CrO_2(NO_3)_2$; $TiCl_4$; $ZnCl_2$; $ZrCl_4$; $HfCl_4$; $AlCl_3$; $SiCl_4$; $GaCl_3$; $SnCl_4$; $CoCl_3$; $N(SiMe_3)Li$, Na, or K; $B(CH_2SiMe_3)_3$; $(Me_3SiCH_2)_4$ Ti, Zr or Hf.

* * * * *

UNITED STATES PATENT AND TRADEMARK OFFICE
CERTIFICATE OF CORRECTION

PATENT NO. : 6,984,591 B1
APPLICATION NO. : 09/553997
DATED : January 10, 2006
INVENTOR(S) : Douglas A. Buchanan et al.

It is certified that error appears in the above-identified patent and that said Letters Patent is hereby corrected as shown below:

Column 5, Line 65:
"z is ≤ 0" should read --z is ≥ 0.--

Column 10, Line 61:
"$C_5 – C_2$" should read --$C_5 – C_{12}$--

Column 11, Line 54:
"of bis CP Co," should read --of bisCp Co,--

Column 12, Line 59:
"$CO_{12}$;" should read --$Co_2$;--

Column 12, Line 60:
"$Mn_2 (CO)_4$" should read --$Mn_2 (CO)_{10}$;--

Column 12, Line 63:
"$CPV (CO)_4$" should read --$CpV (CO)_4$--

Column 13, Line 66:
"$tri-OC(CH_3)_{31}$" should read --$tri-OC(CH_3)_3$,--

Column 14, Line 66:
"unstable amino-containing: compounds which"

should read

--unstable amino-containing compounds which--

Column 21, Line 48:
"$Vsi_2, WSI_2$" should read --$Vsi_2, Wsi_2$,--

UNITED STATES PATENT AND TRADEMARK OFFICE
CERTIFICATE OF CORRECTION

PATENT NO. : 6,984,591 B1
APPLICATION NO. : 09/553997
DATED : January 10, 2006
INVENTOR(S) : Douglas A. Buchanan et al.

It is certified that error appears in the above-identified patent and that said Letters Patent is hereby corrected as shown below:

Column 29, Line 2, Claim 1:
"nitrate, nitrite" should read --nitrate, nitrile--

Column 29, Line 54, Claim 6:
"suflides, nitrites" should read --sulfides, nitriles--

Column 32, Line 42, Claim 34:
LaSrCO$_3$" should read --LaSrCoO$_3$--

Column 34, Line 17:
"CO$_2$(CO)$_8$;" should read --Co$_2$(CO)$_8$;--

Signed and Sealed this

Twenty-second Day of August, 2006

JON W. DUDAS
*Director of the United States Patent and Trademark Office*